(12) United States Patent
Kang

(10) Patent No.: US 9,468,058 B2
(45) Date of Patent: Oct. 11, 2016

(54) LIGHT EMITTING DEVICE AND LIGHT SOURCE DRIVING APPARATUS

(71) Applicant: SAMSUNG ELECTRONICS CO., LTD., Suwon-Si, Gyeonggi-do (KR)

(72) Inventor: Kyu Cheol Kang, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/491,462

(22) Filed: Sep. 19, 2014

(65) Prior Publication Data

US 2015/0195874 A1 Jul. 9, 2015

(30) Foreign Application Priority Data

Jan. 8, 2014 (KR) ........................ 10-2014-0002446

(51) Int. Cl.
*H05B 33/08* (2006.01)
*H01L 33/38* (2010.01)
*H01L 33/62* (2010.01)

(52) U.S. Cl.
CPC ............ *H05B 33/083* (2013.01); *H01L 33/382* (2013.01); *H01L 33/62* (2013.01)

(58) Field of Classification Search
CPC ............. H05B 33/00–33/0896; H01L 27/153; H01L 33/14
USPC .................................................. 315/184–193
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |

(Continued)

FOREIGN PATENT DOCUMENTS

| | | |
|---|---|---|
| JP | 2011-529634 A | 12/2011 |
| KR | 10-2012-0082468 A | 7/2012 |

(Continued)

*Primary Examiner* — Douglas W Owens
*Assistant Examiner* — Jonathan Cooper
(74) *Attorney, Agent, or Firm* — Lee & Morse, P.C.

(57) ABSTRACT

A light emitting device includes a light source unit, a connection controller, and a driving controller. The light source unit includes a first LED array including a plurality of first LEDs connected in series and a second LED array including a plurality of second LEDs connected in series. The connection controller selectively sets a connection structure between the first and second LED arrays as a series connection, a parallel connection, or a series-parallel connection based on a peak value of a driving voltage driving the light source unit. The driving controller controls the number of LEDs driven in the light source unit according to a magnitude of the driving voltage. Each of the first and second LED arrays is connected between a plurality of first nodes and a plurality of second nodes.

18 Claims, 19 Drawing Sheets

(56) References Cited

U.S. PATENT DOCUMENTS

| | | |
|---|---|---|
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,207,685 B2 | 6/2012 | Cheng et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2010/0096652 A1* | 4/2010 | Choi .................. H01L 33/08 257/98 |
| 2010/0308739 A1 | 12/2010 | Shteynberg et al. |
| 2011/0127922 A1 | 6/2011 | Sauerlaender |
| 2011/0199003 A1* | 8/2011 | Muguruma .......... H05B 33/083 315/122 |
| 2012/0299490 A1* | 11/2012 | Lee .................... H05B 33/0824 315/191 |
| 2013/0002155 A1* | 1/2013 | Hu .................... H05B 33/0809 315/186 |
| 2014/0043810 A1* | 2/2014 | Jo ........................ F21V 13/04 362/235 |
| 2014/0097763 A1 | 4/2014 | Kim et al. |
| 2015/0195874 A1* | 7/2015 | Kang .................. H05B 33/083 315/192 |

FOREIGN PATENT DOCUMENTS

| | | |
|---|---|---|
| KR | 10-2013-0032666 A | 4/2013 |
| KR | 10-2013-0047196 A | 5/2013 |
| KR | 10-2013-0048927 A | 5/2013 |
| KR | 10-2013-0085843 A | 7/2013 |
| KR | 10-1285644 B1 | 7/2013 |

* cited by examiner

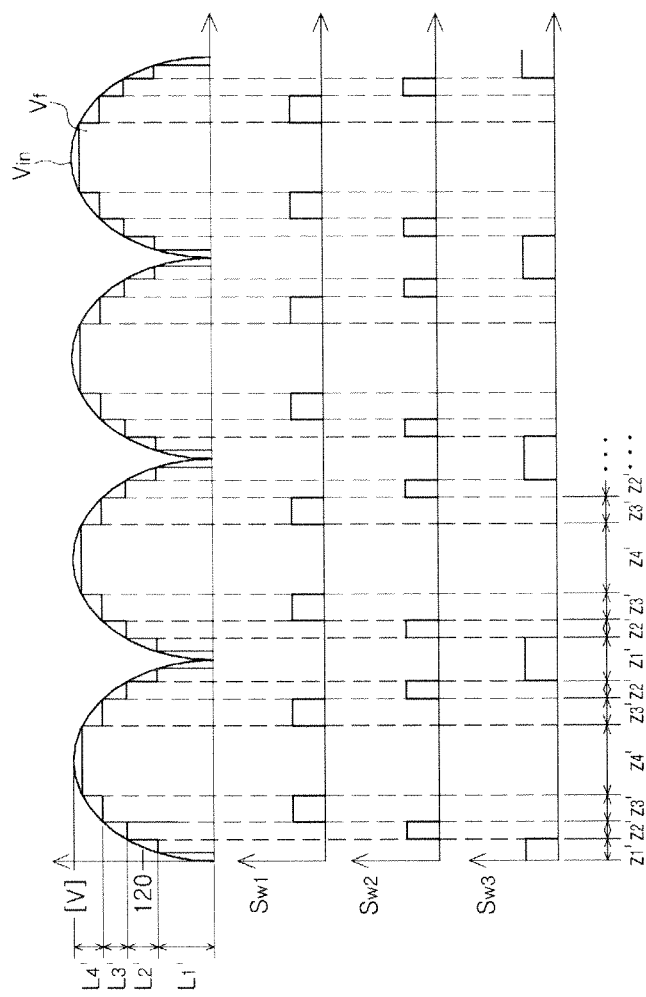

LIGHT EMITTING DEVICE AND LIGHT SOURCE DRIVING APPARATUS

CROSS-REFERENCE TO RELATED APPLICATION

This application claims the benefit of Korean Patent Application No. 10-2014-0002446 filed on Jan. 8, 2014, with the Korean Intellectual Property Office, the disclosure of which is incorporated herein by reference.

BACKGROUND

The present disclosure relates to a light emitting device and a light source driving apparatus.

Compared with a filament-based light emitting devices, light emitting diodes (LEDs) have various advantages such as relatively long lifespans, low degrees of power consumption, excellent initial driving characteristics, high vibration resistance, and the like, and thus, demand for LEDs continues to grow. Meanwhile, a light emitting device using LEDs may have problems in terms of compatibility in that a connection structure between the LEDs, such as a series connection structure, a parallel connection structure, or the like, may need to be reconfigured according to a peak value of an input alternative current (AC) voltage, based on threshold voltage characteristics of the LEDs. Thus, research and development of a light emitting device securing compatibility with respect to an external input voltage amplitude and having improved efficiency are required in the art.

SUMMARY

An aspect of the present disclosure may provide a light emitting device and a light source driving apparatus having high compatibility and improved efficiency.

However, objects of the present disclosure are not limited thereto and objects and effects that may be recognized from technical solutions or embodiments described hereinafter may also be included although not explicitly mentioned.

According to an aspect of the present disclosure, a light emitting device may include a light source unit, a connection controller, and a driving controller. The light source unit includes a first LED array including a plurality of first LEDs connected in series and a second LED array including a plurality of second LEDs connected in series. The connection controller selectively sets a connection structure between the first and second LED arrays as a series connection, a parallel connection, and a series-parallel connection based on a peak value of a driving voltage driving the light source unit. The driving controller controls the number of LEDs driven by the driving voltage in the light source unit according to a magnitude of the driving voltage, wherein each of the first and second LED arrays is connected between a plurality of first nodes and a plurality of second nodes.

The connection controller may include a connection switch unit configured to set the connection structure between the first and second LED arrays through a switching operation, and a connection switching controller configured to control a switching operation of the connection switch unit.

The connection switch unit may include a plurality of first connection switches each connected between the plurality of first nodes or the plurality of second nodes; at least one second connection switch connected to at least one node between the plurality of first LEDs and at least one node between the plurality of second LEDs; and at least one third connection switch connected to at least one of the plurality of first nodes and at least one of the plurality of second nodes.

When the peak value of the driving voltage is smaller than a pre-set value, the connection switching controller may switch the plurality of first connection switches and the at least one second connection switch ON and switch the at least one third connection switch OFF, and when the peak value of the driving voltage is greater than the pre-set value, the connection switching controller may switch the at least one third connection switch ON and switch the plurality of first connection switches and the at least one second connection switch OFF.

The driving controller may include at least one driving switch connecting one node from among nodes between the plurality of first LEDs and nodes between the plurality of second LEDs with a ground; and a driving switching controller configured to control a switching operation of the at least one driving switch.

The connection controller may set the connection structure between the first and second LED arrays of the light source unit such that first to nth light emitting groups (n is an integer equal to or greater than 2) are connected in series, and the driving switching controller may control the number of light emitting groups that are driven by the driving voltage according to ON/OFF switching of the driving switch.

The driving switching controller may change the number of light emitting groups that are driven by the driving voltage on a periodic basis in synchronization with a periodic variation of the driving voltage.

When a magnitude of the driving voltage is increased, the driving switching controller may control a switching operation of the at least one driving switch such that the number of driven light emitting groups among the first to nth light emitting groups is increased.

Each of the first to nth light emitting groups may have a connection structure in which at least one of the plurality of first LEDs and at least one of the plurality of second LEDs are connected in parallel.

Each of the first to nth light emitting groups may have a connection structure in which two or more of the plurality of first LEDs and the plurality of second LEDs are connected in series.

The light source unit may further include a third LED array connected between the plurality of first nodes and the plurality of second nodes and having a plurality of third LEDs connected in series, and the connection controller may be configured to selectively set a connection structure among the first, second, and third LED arrays as a series connection, a parallel connection, and a series-parallel connection based on the peak value of the driving voltage.

The connection controller may include a connection switch unit configured to set the connection structure between the first, second, and third LED arrays through a switching operation; and a connection switching controller configured to control a switching operation of the connection switch unit.

The connection switch unit may include a plurality of first connection switches each connected between the plurality of first nodes or between the plurality of second nodes; a plurality of second connection switches; and at least one third connection switch connected to at least one of the plurality of first nodes and at least one of the plurality of second nodes. The plurality of second connection switches may include: a connection switch connecting at least one of the nodes between the plurality of first LEDs and at least one of the nodes between the plurality of second LEDs, and a connection switch connecting at least one of the nodes between the plurality of second LEDs and at least one of the nodes between the plurality of third LEDs.

Each of the LEDs may include a light emitting laminate in which a first conductivity-type semiconductor layer, an active layer, and a second conductivity-type semiconductor layer are stacked; and a conductive via electrically connected to the first conductivity-type semiconductor layer through the second conductivity-type semiconductor layer and the active layer and electrically insulated from the second conductivity-type semiconductor layer and the active layer, wherein an area of a region in which the conductive via and the first conductivity-type semiconductor layer are in contact may be 1% to 5% of a planar area of the light emitting laminate.

The first and second LED arrays may emit white light having two or more peak wavelengths, the white light may be positioned in a segment linking (x, y) coordinates (0.4476, 0.4074), (0.3484, 0.3516), (0.3101, 0.3162), (0.3128, 0.3292), and (0.3333, 0.3333) in a CIE 1931 chromaticity diagram or may be positioned in a region surrounded by a spectrum of black body radiation and the segment, and a color temperature of the white light may range from 2000K to 20000K.

The driving voltage may be a rectified sine wave.

The light emitting device may further include a rectifying unit rectifying an alternating current (AC) voltage provided from the outside and applying the rectified AC voltage to the light source unit.

According to another aspect of the present disclosure, a light source driving apparatus controls an operation of a light source unit including a first LED array having a plurality of first LEDs connected in series and a second LED array having a plurality of second LEDs connected in series, the first LED array and the second LED array being connected between a plurality of first nodes and a plurality of second nodes, may include a connection controller and a driving controller. The connection controller is configured to selectively set a connection structure between the first and second LED arrays as a series connection, a parallel connection, and a series-parallel connection based on a peak value of a driving voltage provided to the light source unit. The driving controller is configured to control the number of LEDs that are driven in the light source unit according to a magnitude of the driving voltage provided to the light source unit.

The driving controller may change the number of LEDs that are driven in the light source unit on a periodic basis in synchronization with a periodic variation of the driving voltage.

According to another aspect of the present disclosure, a light source driving apparatus may include a connection controller and a driving controller. The connection controller is configured to selectively set a connection structure between a plurality of LEDs such that the LEDs are arranged into a series connection of first to nth light emitting groups (n is an integer equal to or greater than 2). The connection controller selectively sets a connection structure between LEDs in each light emitting group as a series connection and a parallel connection based on a peak value of a driving voltage. The driving controller is configured to control the number of light emitting groups that are driven by the driving voltage based on a current value of the driving voltage.

The driving controller may control the number of light emitting groups that are driven by the driving voltage on a periodic basis in synchronization with a periodic variation of the driving voltage.

A plurality of driving switches may be operative to individually connect to ground each of the nodes between light emitting groups in the series connection of first to nth light emitting groups, and the driving controller may control the number of light emitting groups that are driven by the driving voltage by controlling ON/OFF switching of the driving switches.

The foregoing technical solutions do not fully enumerate all of the features of the present disclosure. The foregoing and other objects, features, aspects and advantages of the present disclosure will become more apparent from the following detailed description of the present disclosure.

BRIEF DESCRIPTION OF DRAWINGS

The above and other aspects, features and other advantages of the present disclosure will be more clearly understood from the following detailed description taken in conjunction with the accompanying drawings, in which:

FIGS. 6A, 6B, 7A, and 7B are circuit and timing diagrams illustrating operations of the light emitting device and the light source driving apparatus according to the exemplary embodiment of FIG. 5;

DETAILED DESCRIPTION

Figure 1:
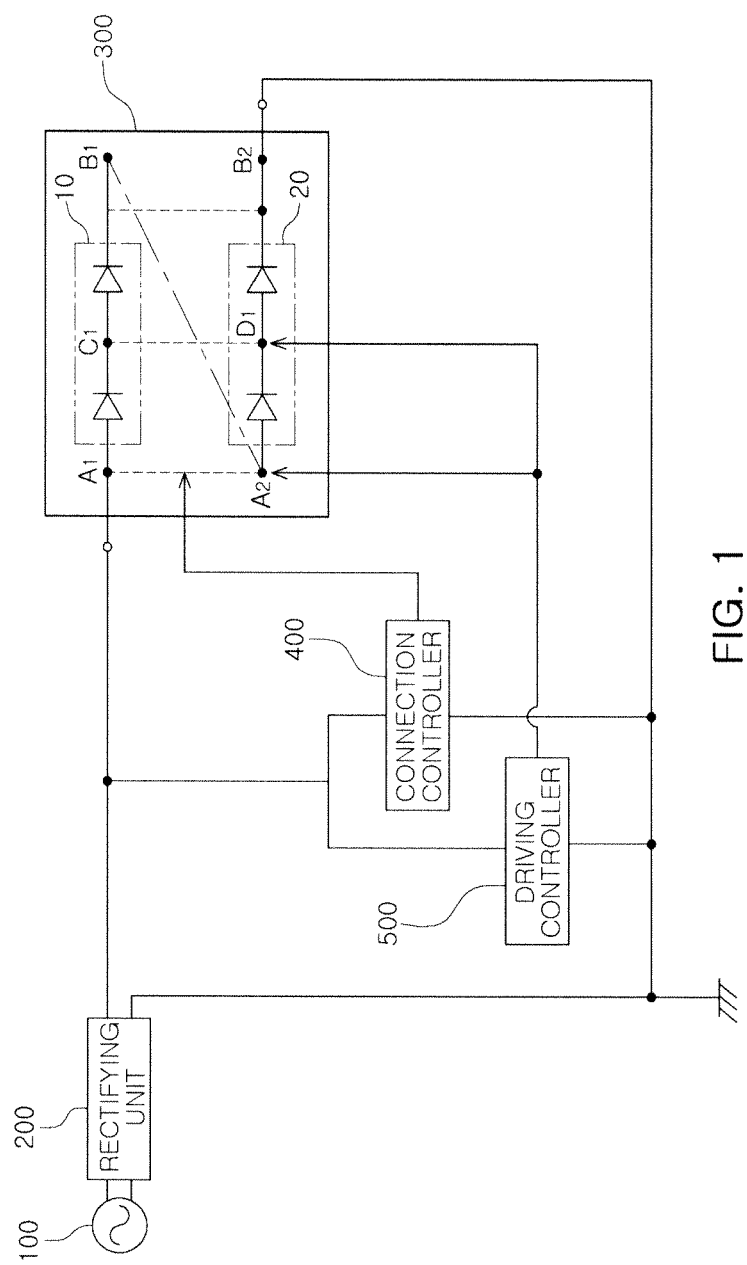
FIG. 1 is a view conceptually illustrating a light emitting device and a light source driving apparatus according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a view conceptually illustrating a light emitting device and a light source driving apparatus according to an exemplary embodiment of the present disclosure.

Referring to FIG. 1, the light emitting device according to the present exemplary embodiment includes a light source unit 300, a connection controller 400, and a driving controller 500.

In the present exemplary embodiment, the light source unit 300 is driven by a driving voltage, and may include a plurality of light emitting diodes (LEDs). The connection controller 400 may be provided as a means for determining and selectively setting a connection structure between the plurality of LEDs provided in the light source unit 300 based on a peak value of the driving voltage. The driving controller 500 may control a number (or amount) of LEDs driven in the light source unit 300 according to a magnitude of the driving voltage. For example, the driving controller 500 may control a number of LEDs connected in series in the light source unit 300. Here, the connection controller 400 and the driving controller 500, serving to control an operation of the light source unit 300, may constitute a single light source driving apparatus.

In detail, referring to FIG. 1, the light source unit 300 may include a first LED array 10 having a plurality of first LEDs, and a second LED array 20 having a plurality of second LEDs. The first LED array 10 may be connected between any one node $A_1$ among a plurality of first nodes $A_1$ and $A_2$ and any one node $B_1$ among a plurality of second nodes $B_1$ and $B_2$, and similarly, the second LED array 20 may be connected between any one node $A_2$ among the plurality of first nodes $A_1$ and $A_2$ and any one node $B_2$ among the plurality of second nodes $B_1$ and $B_2$.

The driving controller 500 may control a number of driven LEDs among the plurality of LEDs provided in the light source unit 300 according to a magnitude of a driving voltage.

In the exemplary embodiment of the present disclosure, the driving voltage may be a direct current (DC) voltage having a sine waveform which has been generated by an external power source 100 providing a commercial alternating current (AC) voltage that has subsequently been rectified by a rectifying unit 200. Conceptually, in a case in which the commercial AC voltage has a 120V amplitude, a magnitude of the driving voltage may continuously change over time between 0V to 120V with a predetermined period.

Here, with respect to the driving voltage whose magnitude changes over time, when the magnitude of the driving voltage is increased, the driving controller 500 may perform control such that the number of driven LEDs, among the plurality of LEDs provided in the light source unit 300, is increased, and when the magnitude of the driving voltage is decreased, the driving controller 500 may perform control such that the number of driven LEDs is reduced. Namely, at a point in time at which the driving voltage having a magnitude changing over time is sufficient to only drive some (but not all) of the plurality of LEDs provided in the light source unit 300 due to threshold voltage characteristics of the LEDs, the driving controller 500 may be configured to only drive some of the LEDs, thus promoting improvement of the driving efficiency of the LEDs provided in the light source unit 300.

The connection controller 400 may determine and selectively set a connection structure between the plurality of LEDs provided in the light source unit 300 based on the peak value of the driving voltage.

In an exemplary embodiment, the connection controller 400 may determine and selectively set a connection structure between the first and second LED arrays 10 and 20, as a series connection, a parallel connection, or a series-parallel connection based on the peak value of the rectified driving voltage having a sine wave.

For example, in a case that the peak value of the driving voltage is 120V, for example, in a case that the commercial AC voltage generated by the external power source 100 is 120V, the connection controller 400 may determine and selectively set a connection structure between the first and second LED arrays 10 and 20 as a parallel structure. Also, in a case that the peak value of the driving voltage is 220V, for example, in a case that the commercial AC voltage generated by the external power source 100 is 220V, the connection controller 400 may determine and selectively set a connection structure between the first and second LED arrays 10 and 20 as a series connection.

Accordingly, based on the threshold voltage characteristics of the LEDs, a threshold voltage value represented by the light source unit 300 may be appropriately calculated and may be adjusted (or changed) based on a magnitude of the commercial AC voltage driving the light source unit 300.

Hereinafter, the light emitting device and the light source driving apparatus according to the exemplary embodiment of the present disclosure will be described in more detail with reference to FIGS. 2, 3A, 3B, 4A, and 4B.

Figure 2:
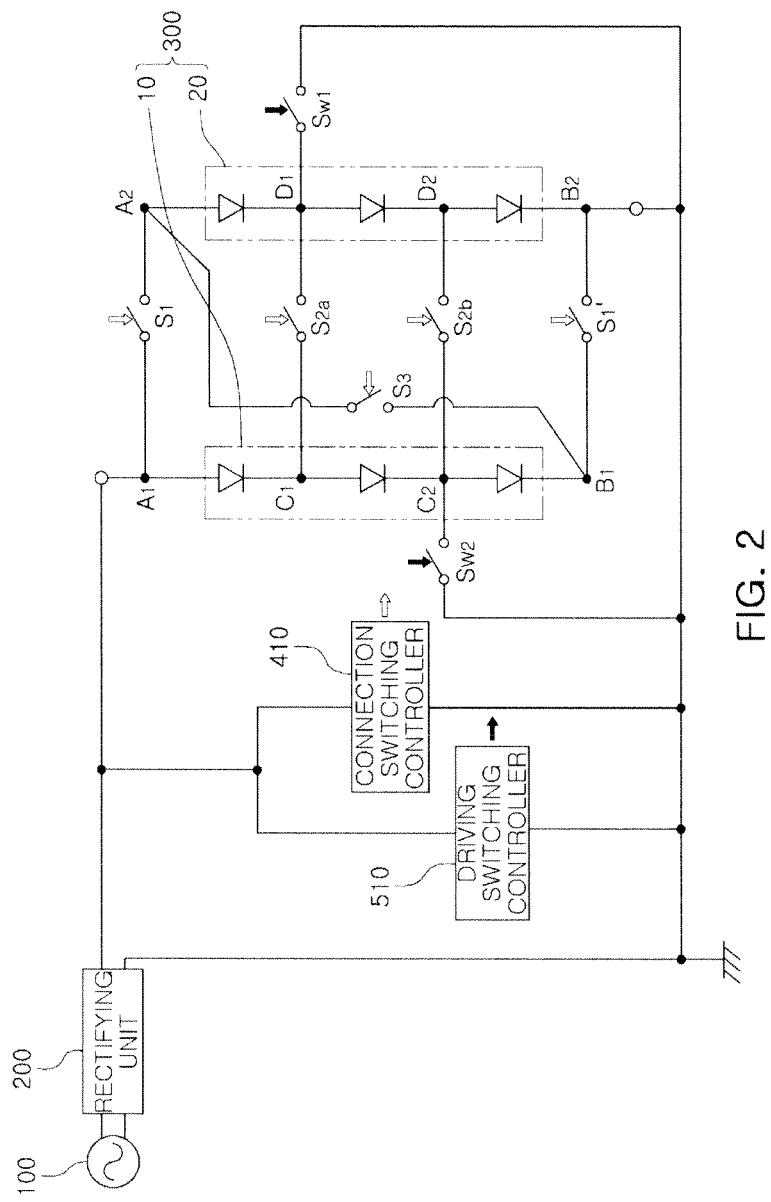
FIG. 2 is a circuit diagram illustrating a light emitting device and a light source driving apparatus according to an exemplary embodiment of the present disclosure.

FIG. 2 is a circuit diagram illustrating a light emitting device and a light source driving apparatus according to an exemplary embodiment of the present disclosure, and FIGS. 3A, 3B, 4A, and 4B are circuit diagrams illustrating operations of the light emitting device and the light source driving apparatus according to the exemplary embodiment of FIG. 2.

Referring to FIG. 2, the light emitting device according to the present exemplary embodiment includes a light source unit 300, a connection controller, and a driving controller. The connection controller and the driving controller may be provided as a single light source driving apparatus for controlling operations of the light source unit 300.

In the present exemplary embodiment, the light source unit 300 may include a first LED array 10 connected between any one node $A_1$ among a plurality of first nodes A and $A_2$ and any one node $B_1$ among a plurality of second nodes $B_1$ and $B_2$ and a second LED array 20 connected between any one node $A_2$ among the plurality of first nodes $A_1$ and $A_2$ and any one node $B_2$ among the plurality of second nodes $B_1$ and $B_2$.

The first LED array 10 has a plurality of first LEDs connected in series. The plurality of first LEDs may include first to pth light emitting elements sequentially adjacent to the first node (p is an integer equal to or greater than 2).

Based on the circuit diagram of FIG. 2, the first LED array 10 includes a plurality of first LEDs, and the plurality of first LEDs include first to third light emitting elements sequentially adjacent to the first node $A_1$.

Similarly, the second LED array 20 has a plurality of second LEDs connected in series. The plurality of second LEDs may include first to qth light emitting elements sequentially adjacent to a first node (q is an integer equal to or greater than 2). In FIG. 2, the plurality of second LEDs are illustrated as including first to third light emitting elements sequentially adjacent to the first node $A_2$.

In the present exemplary embodiment, the plurality of first LEDs and the plurality of second LEDs are illustrated as each having the same number of light emitting elements, but the present disclosure is not limited thereto and the plurality of first LEDs and the plurality of second LEDs may be provided with different numbers of LEDs (namely, p≠q).

The connection controller may include a connection switch unit and a connection switching controller 410 controlling a switching operation of the connection switch unit. The connection switch unit may determine and selectively set a connection structure between the first and second LED arrays 10 and 20 by a switching operation.

In detail, the connection switch unit may include a plurality of first connection switches $S_1$ and $S_1'$, at least one second connection switch $S_{2a}$ and $S_{2b}$, and at least one third connection switch $S_3$.

A portion of the plurality of first connection switches may be connected between a plurality of first nodes (e.g., nodes A1 and A2), and the other portion thereof may be connected between a plurality of second nodes (e.g., nodes B1 and B2).

In the case of the present exemplary embodiment, as illustrated in FIG. 2, the connection switch unit includes two first connection switches $S_1$ and $S_1'$, and among these, one first connection switch $S_1$ is connected between the plurality of first nodes $A_1$ and $A_2$, and the other first connection switch $S_1'$ is connected between the plurality of second nodes $B_1$ and $B_2$.

The at least one second connection switch may connect at least one node between the plurality of first LEDs and at least one node between the plurality of second LEDs.

In the case of the present exemplary embodiment, as illustrated in FIG. 2, the connection switch unit includes two second connection switches $S_{2a}$ and $S_{2b}$. Among these, the one second connection switch $S_{2a}$ is connected between a node $C_1$ between first and second light emitting elements among the plurality of first LEDs and a node $D_1$ between first and second light emitting elements among the plurality of second LEDs (namely, selectively connects the nodes $C_1$ and $D_1$). The other second connection switch $S_{2b}$ is connected between a node $C_2$ between second and third light emitting elements among the plurality of first LEDs and a node $D_2$ between second and third light emitting elements among the plurality of second LEDs (namely, selectively connects the nodes $C_2$ and $D_2$).

The third connection switch is connected between at least one of the plurality of first nodes and at least one of the plurality of second nodes.

In the case of the present exemplary embodiment, as illustrated in FIG. 2, the connection switch unit includes a single third connection switch $S_3$, and the third connection switch $S_3$ is connected between one first node $A_2$ among a plurality of first nodes $A_1$ and $A_2$ and one second node $B_2$ among a plurality of second nodes $B_1$ and $B_2$ (namely, selectively connects the nodes $A_2$ and $B_1$).

The first to third connection switches $S_1$, $S_1'$, $S_{2a}$, $S_{2b}$, and $S_3$ may determine and set a connection structure between the first and second LED arrays 10 and 20 as a parallel connection or a series-parallel connection through selective ON/OFF switching operations of the switches, and ON/OFF switching of the first to third connection switches $S_1$, $S_1'$, $S_{2a}$, $S_{2b}$, and $S_3$ may be performed according to a switching signal output by the connection switching controller 410 (please refer to white arrows in FIG. 2). The connection switching controller 410 may control ON/OFF switching operations of the first to third connection switches $S_1$, $S_1'$, $S_{2a}$, $S_{2b}$, and $S_3$ based on the peak value of the driving voltage.

The driving controller may include at least one driving switch and a driving switching controller 510 controlling a switching operation of the driving switch. The driving switch may selectively connect at least one of the nodes between the plurality of first LEDs and the nodes between the plurality of second LEDs with ground.

In the case of the present exemplary embodiment, referring to FIG. 2, the driving controller may include two driving switches $S_{w1}$ and $S_{w2}$, and among these, one driving switch (hereinafter, referred to as a 'first driving switch $S_{w1}$') connects the node $D_1$ interposed between the first and second light emitting elements among the plurality of second LEDs to ground, and the other driving switch (hereinafter, referred to as a 'second driving switch $S_{w2}$') connects the node $C_2$ interposed between the second and third light emitting elements among the plurality of first LEDs to ground.

The first and second driving switches $S_{w1}$ and $S_{w2}$ may control the number of LEDs driven in the light source unit 300 through an ON/OFF switching operation, and the ON/OFF switching of the first and second driving switches $S_{w1}$ and $S_{w2}$ may be performed according to a switching signal (please see black arrows) applied from the driving switching controller 510. With respect to a magnitude of a driving voltage changing over time, the driving switching controller 510 may control the ON/OFF switching operations of the driving switches $S_{w1}$ and $S_{w2}$ such that, when the magnitude of the driving voltage is increased, the number of driven LEDs among the plurality of LEDs provided in the light source unit 300 is increased, and when the magnitude of the driving voltage is decreased, the number of driven LEDs among the plurality of LEDs provided in the light source unit 300 is reduced.

Hereinafter, operations of the light emitting device and the light source driving apparatus according to the exemplary embodiment of FIG. 2 will be described in detail with reference to FIGS. 3A, 3B, 4A, and 4B.

The connection switching controller 410 may compare the peak value of the driving voltage with a pre-set value, and when the peak value of the driving voltage is smaller than the pre-set value, the connection switching controller 410 may switch ON (so as to close the switches) the plurality of first connection switches $S_1$ and $S_1'$ and the at least one second connection switch $S_{2a}$ and $S_{2b}$, and switch OFF (so as to open the switch) the at least one third connection switch $S_3$.

For example, in a case in which the amplitude of a commercial AC voltage generated by the external power 100 is 120V, the driving voltage having a sine waveform rectified by the rectifying unit 200 and applied to the light source unit 300 changes over time according to a predetermined period between 0V and 120V, and has a peak value of 120V. In this case, the connection switching controller 410 compares the peak value 120V of the driving voltage with the pre-set value (for example, 150V), and when the peak value of the driving voltage is lower than the pre-set value, the connection switching controller 410 switches the plurality of first and second connection switches $S_1$, $S_1'$, $S_{2a}$, and $S_{2b}$ ON, and switches the single third connection switch $S_3$ OFF.

Accordingly, a connection structure between the first and second LED arrays 10 and 20 is a parallel connection, and the light source unit 300 may be classified as including first to nth light emitting groups (i.e., the LEDs of the LED arrays may be connected to form first to nth light emitting groups), and the number of driven light emitting groups at any time is controlled according to ON/OFF switching of the driving switches $S_{w1}$ and $S_{w2}$ (n is an integer equal to or greater than 2). The first to nth light emitting groups may be connected in series, and each of the first to nth light emitting groups may have a connection structure connecting at least one of the plurality of first LEDs and at least one of the plurality of second LEDs.

Figure 3A:
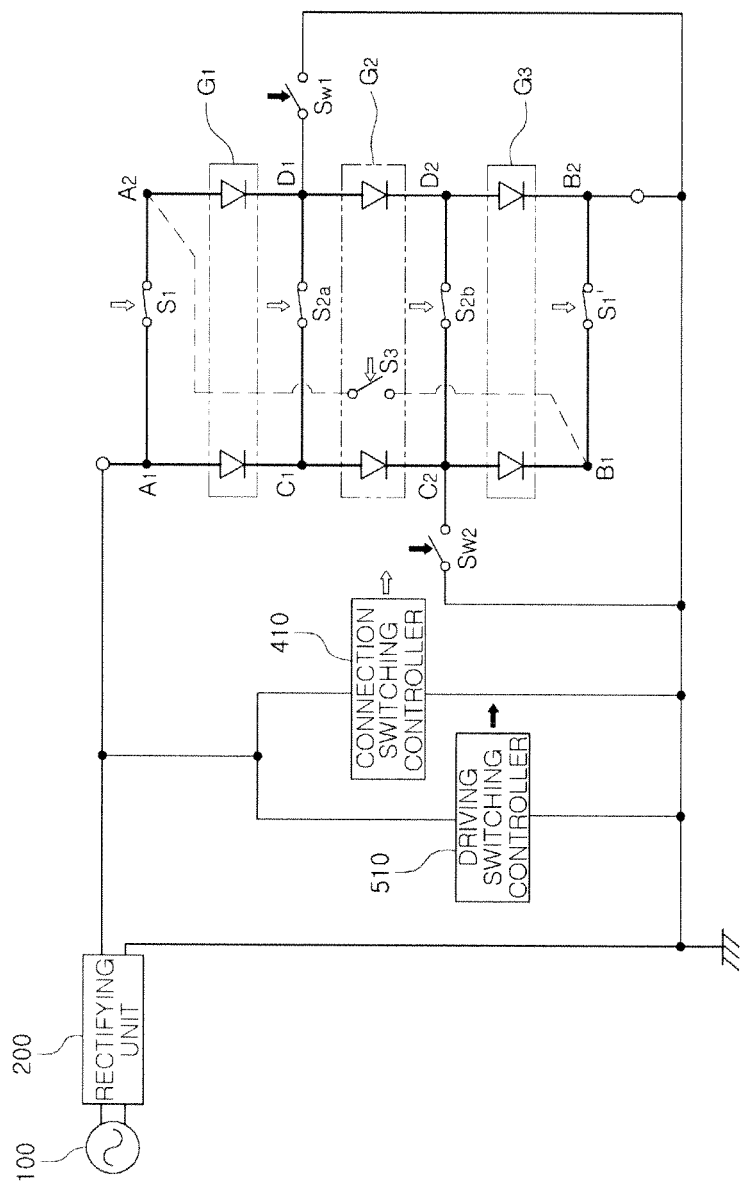
FIGS. 3A, 3B, 4A, and 4B are circuit and timing diagrams illustrating operations of the light emitting device and the light source driving apparatus according to the exemplary embodiment of FIG. 2.

In detail, in the case of the exemplary embodiment illustrated in FIG. 3A, the light source unit 300 is classified as including first to third light emitting groups G1 to G3 connected in series, and the first light emitting group G1 may have a connection structure connecting a first light emitting element among the plurality of first LEDs and a first light emitting elements among the plurality of second LEDs in parallel. Similarly, the second light emitting group G2 may have a connection structure connecting a second light emitting element among the plurality of first LEDs and a second light emitting element among the plurality of second LEDs in parallel, and the third light emitting group G3 may have a connection structure connecting a third light emitting element among the plurality of first LEDs and a third light emitting element among the plurality of second LEDs in parallel.

In the present exemplary embodiment, the driving switches $S_{w1}$ and $S_{w2}$ may control the number of light emitting groups that are driven at any time among the first to third light emitting groups G1 to G3 through ON/OFF switching. In particular, the driving switches $S_{w1}$ and $S_{w2}$ may control the number of light emitting groups that are driven based on a current/instantaneous value of the driving voltage. In general, the driving switches $S_{w1}$ and $S_{w2}$ control the number of light emitting groups that are driven on a periodic basis in synchronization with a period of the driving voltage.

Figure 3B:
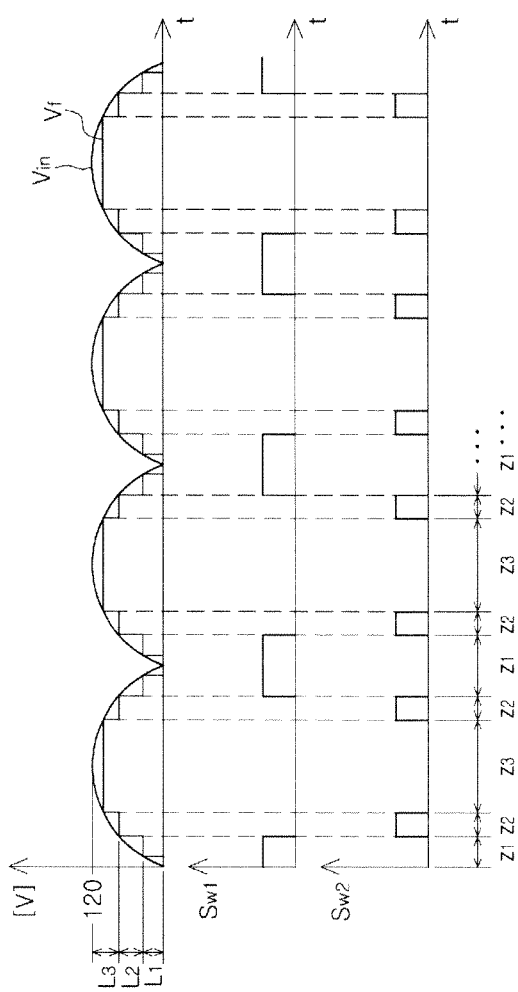

In detail, referring to FIG. 3B together with FIG. 3A, the driving switching controller 510 divides a magnitude of a driving voltage Vin changing over time into three voltage levels L1 to L3, and applies an ON switching signal to the first driving switch $S_{w1}$ during a section (first section z1) in which the magnitude of the driving voltage Vin corresponds to the first voltage level L1 which is lowest (i.e., during a section of time during which the magnitude of the driving voltage Vin is within the range of voltage levels L1). In this case, during the first section z1, the first light emitting group G1 is driven and the second and third light emitting groups G2 and G3 are not driven.

Also, during a section corresponding to the second voltage level L2 (second section z2) (i.e., during a section of time during which the magnitude of the driving voltage Vin is within the range of voltage levels L2), the driving switching controller 510 applies an ON switching signal to the second driving switch $S_{w2}$, and in this case, during the second section z2, the first and second light emitting groups G1 and G2 are driven and the third light emitting group G3 is not driven. Similarly, during a section corresponding to the third voltage level L3 (third section z3) (i.e., during a section of time during which the magnitude of the driving voltage Vin is within the range of voltage levels L3), the driving switching controller 510 switches off both the first and second driving switches $S_{w1}$ and $S_{w2}$, and in this case, all of the first to third light emitting groups G1 to G3 may be driven.

Here, the first to nth light emitting groups are sequentially driven, and at a point in time at which the nth light emitting group is driven, all of the first to (n−1)th light emitting groups may be driven. Namely, at a point in time at which the magnitude of the driving voltage Vin (which changes over time) is sufficient to only drive some of the LEDs due to threshold voltage Vf characteristics of the plurality of LEDs provided in the light source unit 300, only some of the LEDs are driven to promote improvement of driving efficiency of the LEDs provided in the light source unit 300.

Meanwhile, in the case of controlling the number of driven LEDs according to each of the light emitting groups with respect to a driving voltage having a magnitude changing over time, a relationship between each driving voltage and a threshold voltage Vf of each light emitting group based on the threshold voltage Vf characteristics of individual LEDs needs to be appropriately considered. Thus, when a peak value of the driving voltage Vin is changed (for example, in a case in which the commercial AC voltage of 120V amplitude received from the external power source 100 is changed to a commercial AC voltage of 220V amplitude), a threshold voltage of each of the light emitting groups needs to be changed.

Thus, the connection controller 400 according to the present exemplary embodiment may determine and set a connection structure between the first and second LED arrays 10 and 20 as a series connection, a parallel connection, or a series-parallel connection based on a peak value of a driving voltage.

Figure 4A:
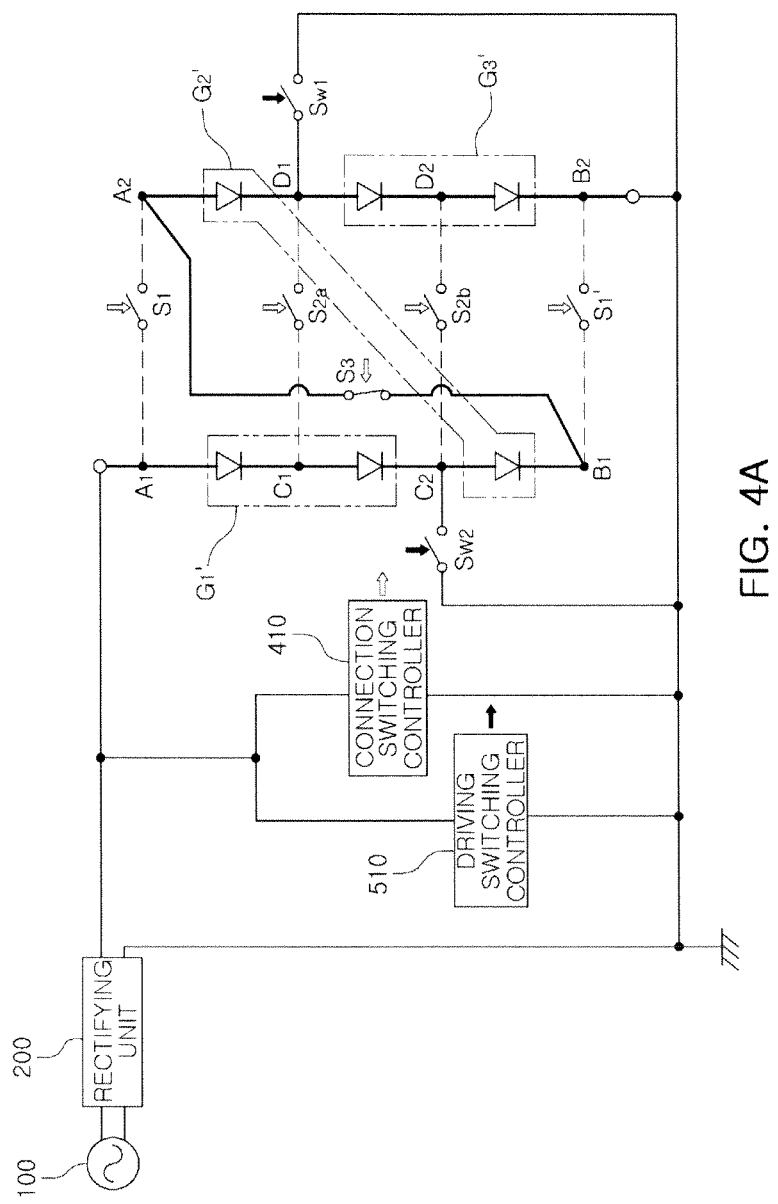

For example, in the case in which the amplitude of a commercial AC voltage generated by the external power source 100 is 220V (and not 120V as in FIG. 3A), a peak value of a driving voltage having a sine waveform rectified by the rectifying unit 200 and applied to the light source unit 300 may be 220V, and in this case, the connection switching controller 410 compares the peak value 220V of the driving voltage with a pre-set value (for example, 150V), and when the peak value of the driving voltage is greater than the pre-set value, the connection switching controller 410 switches the third connection switch S3 ON and switches the plurality of first and second connection switches $S_1$, $S_1'$, $S_{2a}$, and $S_{2b}$ OFF, as illustrated in FIG. 4A.

Accordingly, a connection structure between the first and second LED arrays 10 and 20 is a series connection, and the light source unit 300 is classified as including first to third light emitting groups G1' to G3', and the number of driven light emitting groups is controlled according to ON/OFF switching of the driving switches $S_{w1}$ and $S_{w2}$. Here, the first to third light emitting groups G1' to G3' are connected in series, and each of the first to third light emitting groups G1' to G3' has a connection structure connecting at least two light emitting elements, among a plurality of first LEDs and a plurality of second LEDs, in series.

In detail, as illustrated in FIG. 4A, the first light emitting group G1' has a connection structure of connecting first and second light emitting elements among the plurality of first LEDs. The second light emitting group G2' includes a third light emitting element among the plurality of first LEDs and a first light emitting element among the plurality of second LEDs in series. The third light emitting group G3' has a connection structure connecting second and third light emitting elements among the plurality of second LEDs in series.

In the present exemplary embodiment, driving switches $S_{w1}$ and $S_{w2}$ may control the number of driven light emitting groups among the first to third light emitting groups G1' to G3' through ON/OFF switching.

Figure 4B:
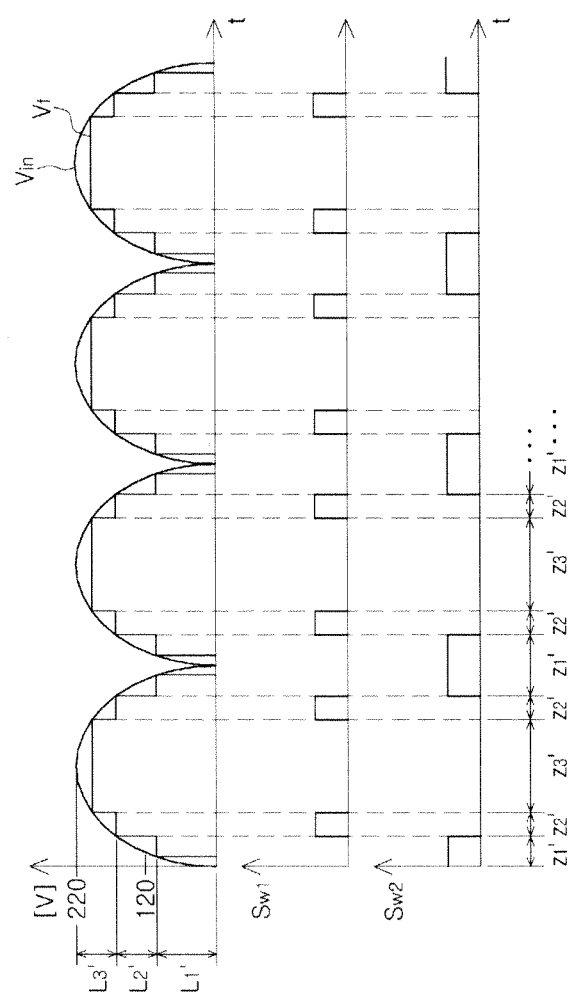

In detail, referring to FIG. 4B together with FIG. 4A, a driving switching controller 510 divides a magnitude of a driving voltage Vin changing over time into three voltage levels L1' to L3', and applies an ON switching signal to the second driving switch $S_{w2}$ during a section (first section z1') in which the magnitude of the driving voltage Vin corresponds to the first voltage level L1' which is lowest. In this case, during the first section z1', the first light emitting group G1' is driven and the second and third light emitting groups G2' and G3' are not driven.

Also, during a section (second section z2') corresponding to the second voltage level L2', the driving switching controller 510 applies an ON switching signal to the first driving switch $S_{w1}$ (while switch $S_{w2}$ is OFF or open), and in this case, during the second section z2', the first and second light emitting groups G1' and G2' are driven and the third light emitting group G3' is not driven. Similarly, during a section corresponding to the third voltage level L3' (third section z3'), the driving switching controller 510 switches both the first and second driving switches $S_{w1}$ and $S_{w2}$ OFF, and in this case, all of the first to third light emitting groups G1' to G3' may be driven.

According to the present exemplary embodiment, driving efficiency of the LEDs provided in the light source unit 300 is improved, and since there is no need to newly design a connection structure of the light source unit 300 no matter which amplitude of voltage is provided by the commercial AC voltage of the external power source 100 connected to drive the light emitting device, compatibility and convenience may be improved.

Figure 5:
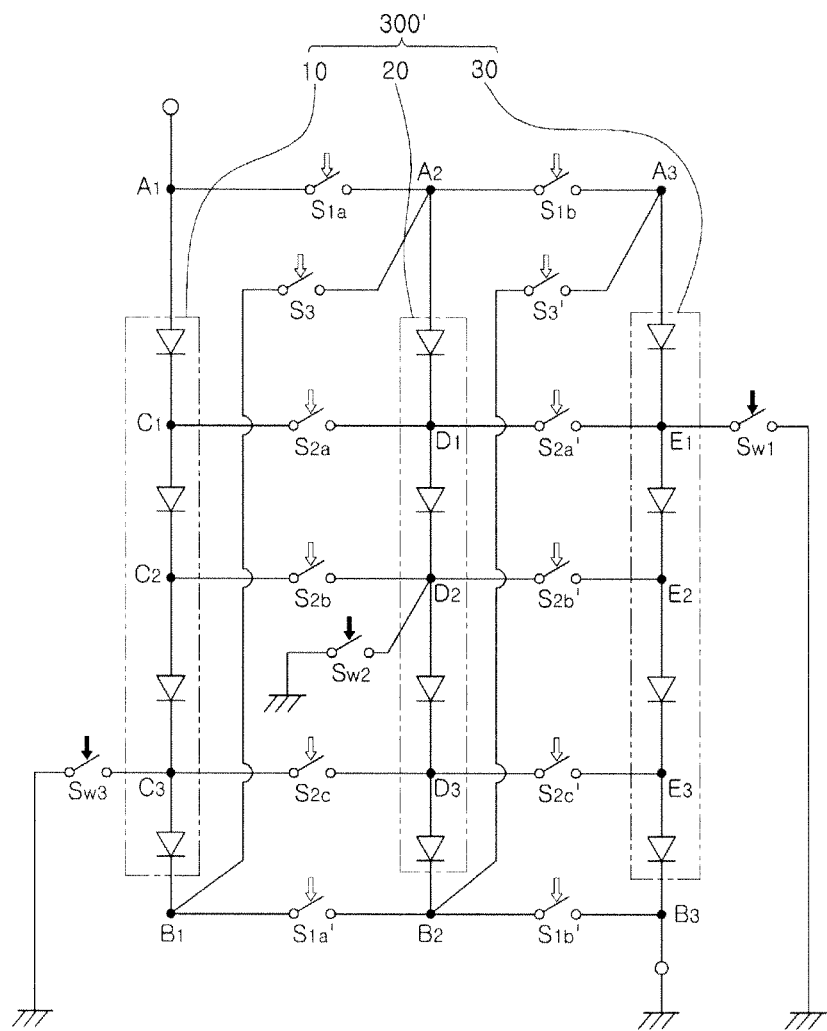
FIG. 5 is a circuit diagram illustrating a light emitting device and a light source driving apparatus according to an exemplary embodiment of the present disclosure.

FIG. 5 is a circuit diagram illustrating a light emitting device and a light source driving apparatus according to another exemplary embodiment of the present disclosure.

Referring to FIG. 5, the light emitting device according to the present exemplary embodiment includes a light source unit 300', a connection controller, and a driving controller. The connection controller and the driving controller may be provided as a single light source driving apparatus for controlling an operation of the light source unit 300'. In FIG. 5, a connection switching controller and a driving switching controller applied in the same manner as those of the former exemplary embodiment are not shown to maintain clarity and simplicity in the figure, and the description will focus primarily on those components that operate differently than similar components described in relation to the previous figures.

In the present exemplary embodiment, the light source unit 300' may further include an mth LED array having a plurality of mth LEDs connected between the plurality of first nodes (e.g., A1, A2, and A3) and the plurality of second nodes (e.g., B1, B2, and B3), and wherein the mth LEDs are connected in series to each other (where m is an integer equal to or greater than 3).

For example, in FIG. 5, the light source unit 300' is illustrated as including a third LED array 30 including a plurality of third LEDs connected between the plurality of first nodes and the plurality of second nodes and connected to one another in series. Here, the plurality of third LEDs may include first to rth light emitting elements sequentially adjacent to the first node (where r is an integer equal to or greater than 2).

Referring to the circuit diagram illustrated in FIG. 5, the first LED array 10 is connected to one node $A_1$ among a plurality of first nodes $A_1$, $A_2$, and $A_3$ and one node $B_1$ among a plurality of second nodes $B_1$, $B_2$, and $B_3$; the second LED array 20 is connected to another node $A_2$ among the plurality of first nodes $A_1$, $A_2$, and $A_3$ and another node $B_2$ among the plurality of second nodes $B_1$, $B_2$, and $B_3$; and the third LED array 30 is connected to the other remaining node $A_3$ among the plurality of first nodes $A_1$, $A_2$, and $A_3$ and the other remaining node $B_3$ among the plurality of second nodes $B_1$, $B_2$, and $B_3$.

Here, each of the first to third LED arrays 10, 20, and 30 includes a plurality of first to third LEDs, and each of the plurality of first to third LEDs includes first to fourth light emitting elements.

Meanwhile, it is illustrated that the plurality of first to third LEDs have the same number of light emitting elements, but the present disclosure is not limited thereto and the plurality of first to third LEDs may be provided with different numbers of light emitting elements (e.g., p≠q, p≠r, and q≠r).

The connection controller may determine and set a connection structure among the first to third LED arrays 10 to 30 as a series connection, a parallel connection, or a series-parallel connection based on a peak value of a driving voltage. To this end, the connection controller may include a connection switch unit and a connection switching controller controlling a switching operation of the connection switch unit. Here, the connection switch unit may determine a connection structure among the first to third LED arrays 10, 20, and 30 through a switching operation.

Similar to the former exemplary embodiment, the connection switch unit may include a plurality of first to third connection switches $S_{1a}$, $S_{1b}$, $S_{1a'}$, $S_{1b'}$, $S_{2a}$, $S_{2b}$, $S_{2c}$, $S_{2a}'$, $S_{2b}'$, $S_{2c}'$, $S_3$, and $S_3'$.

In detail, the connection switch unit includes four first connection switches $S_{1a}$, $S_{1b}$, $S_{1a'}$, and $S_{1b'}$. The four first connection switches $S_{1a}$, $S_{1b}$, $S_{1a'}$, and $S_{1b'}$ are respectively connected between any one node $A_1$ and the other node $A_2$ among the plurality of first nodes, between the other node $A_2$ and the remaining one node $A_3$, between any one node $B_1$ and the other node $B_2$, and between the other node $B_2$ and the remaining one node $B_3$.

Also, the connection switch unit includes a plurality of connection switches $S_{2a}$, $S_{2b}$, $S_{2c}$, $S_{2a}'$, $S_{2b}'$, and $S_{2c}'$. The plurality of second connection switches may include (2-1)st connection switches $S_{2a}$, $S_{2b}$, and $S_{2c}$ connecting at least one node $C_1$, $C_2$, and $C_3$ between the plurality of first LEDs and at least one node $D_1$, $D_2$, and $D_3$ between the plurality of second LEDs, and (2-2)nd connection switches $S_{2a}'$, $S_{2b}'$, and $S_{2c}'$ connecting at least one of the nodes $D_1$, $D_2$, and $D_3$ between the plurality of second LEDs and at least one node $E_1$, $E_2$, and $E_3$ between the plurality of third LEDs.

In detail, in the present exemplary embodiment, three (2-1)st connection switches $S_{2a}$, $S_{2b}$, and $S_{2c}$ are provided, and the three (2-1)st connection switches $S_{2a}$, $S_{2b}$, and $S_{2c}$ respectively connect the node $C_1$ between the first and second light emitting elements among the plurality of first LEDs and the node $D_1$ between the first and second light emitting elements among the plurality of second LEDs, connect the node $C_2$ between the second and third light emitting elements among the plurality of first LEDs and the node $D_2$ between the second and third light emitting elements among the plurality of second LEDs, and connect the node $C_3$ between the third and fourth light emitting elements among the plurality of first LEDs and the node $D_3$ between the third and fourth light emitting elements among the plurality of second LEDs (namely, respectively connect $C_1$ and $D_1$, $C_2$ and $D_2$, and $C_3$ and $D_3$).

Similarly, three (2-2)nd connection switches $S_{2a}'$, $S_{2b}'$, and $S_{2c}'$ are provided, and the three (2-2)nd connection switches $S_{2a}'$, $S_{2b}'$, and $S_{2c}'$ respectively connect the node $D_1$ between the first and second light emitting elements among the plurality of second LEDs and the node $E_1$ between the first and second light emitting elements among the plurality of third LEDs, connect the node $D_2$ between the second and third light emitting elements among the plurality of second LEDs and the node $E_2$ between the second and third light emitting elements among the plurality of third LEDs, and connect the node $D_3$ between the third and fourth light emitting elements among the plurality of second LEDs and the node $E_3$ between the third and fourth light emitting elements among the plurality of third LEDs (namely, respectively connect $D_1$ and $E_1$, $D_2$ and $E_2$, and $D_3$ and $E_3$).

The third connection switches $S_3$ and $S_3'$ are connected to at least one of the plurality of first nodes $A_1$, $A_2$, and $A_3$ and at least one of the plurality of second nodes $B_1$, $B_2$, and $B_3$. In the present exemplary embodiment, as illustrated in FIG. 5, the connection switch unit includes two third connection switches $S_3$ and $S_3'$, and among the third connection switches $S_3$ and $S_3'$, the one third connection switch $S_3$ connects the other one node $A_2$ among the plurality of first nodes and the one node $B_2$ among the plurality of second nodes, and the other third connection switch $S_3'$ connects the remaining one $A_3$ among the plurality of first nodes and the other one node $B_2$ among the plurality of second nodes.

The driving controller may include at least one driving switch and a driving switching controller controlling a switching operation of the driving switch. The driving switch may connect at least one of a node between the plurality of first LEDs, a node between the plurality of second LEDs, and a node between the plurality of third LEDs, and ground.

In the case of the present exemplary embodiment, referring to FIG. 5, the driving controller includes three driving switches (hereinafter, referred to as first to third driving switches $S_{w1}$, $S_{w2}$, and $S_{w3}$).

In the present exemplary embodiment, the first driving switch $S_{w1}$ connects the node $E_1$ interposed between the first and second light emitting elements among the plurality of third LEDs and ground. The second driving switch $S_{w2}$ connects the node $D_2$ interposed between the second and third light emitting elements among the plurality of second LEDs and ground. The third driving switch $S_{w3}$ connects the node $C_3$ interposed between the third and fourth light emitting elements among the plurality of first LEDs and ground.

Hereinafter, a light emitting device and a light source driving apparatus according to the exemplary embodiment of FIG. 5 will be described in detail with reference to FIGS. 6A, 6B, 7A, and 7B.

Similar to that of the aforementioned exemplary embodiment, the connection switching controller compares the peak value of the driving voltage with a pre-set value, and when the peak value of the driving voltage is smaller than the pre-set value, the connection switching controller may switch ON the plurality of first connection switches $S_{1a}$, $S_{1b}$, $S_{1a'}$, and $S_{1b'}$, and at least one second connection switch $S_{2a}$, $S_{2b}$, $S_{2c}$, $S_{2a'}$, $S_{2b'}$, or $S_{2c'}$, and switch OFF at least one third connection switch $S_3$ or $S_3'$.

Figure 6A:
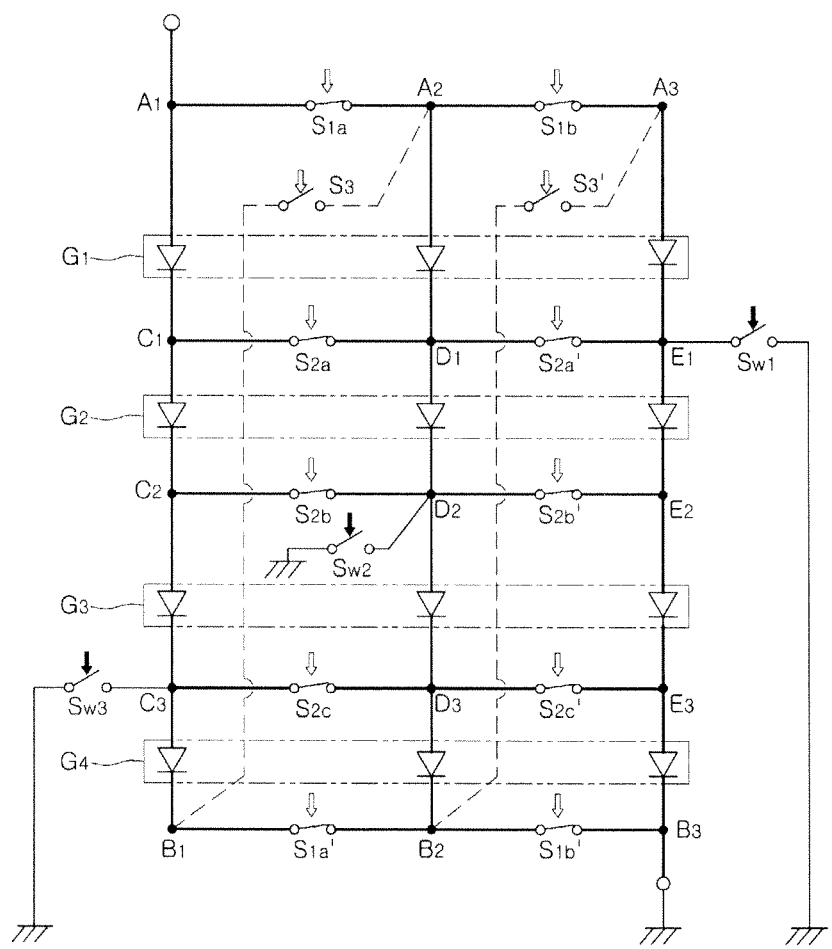

Accordingly, a connection structure among the first to third LED arrays 10, 20, and 30 may be a parallel connection as illustrated in FIG. 6A, and the light source unit 300' is classified as including first to fourth light emitting groups G1 to G4, and the number of light emitting groups that are driven at any point in time is controlled according to ON/OFF switching of the driving switches $S_{w1}$, $S_{w2}$, and $S_{w3}$.

The first light emitting group G1 has a connection structure connecting a first light emitting element among the plurality of first LEDs, a first light emitting element among the plurality of second LEDs, and a third light emitting element among the plurality of third LEDs in parallel, and the other second to fourth light emitting groups G2 to G4 have similar structures.

In the present exemplary embodiment, the first to third driving switches $S_{w1}$, $S_{w2}$, and $S_{w3}$ may control the number of light emitting groups that are driven at any point in time from among the first to fourth light emitting groups G1 to G4.

Figure 6B:
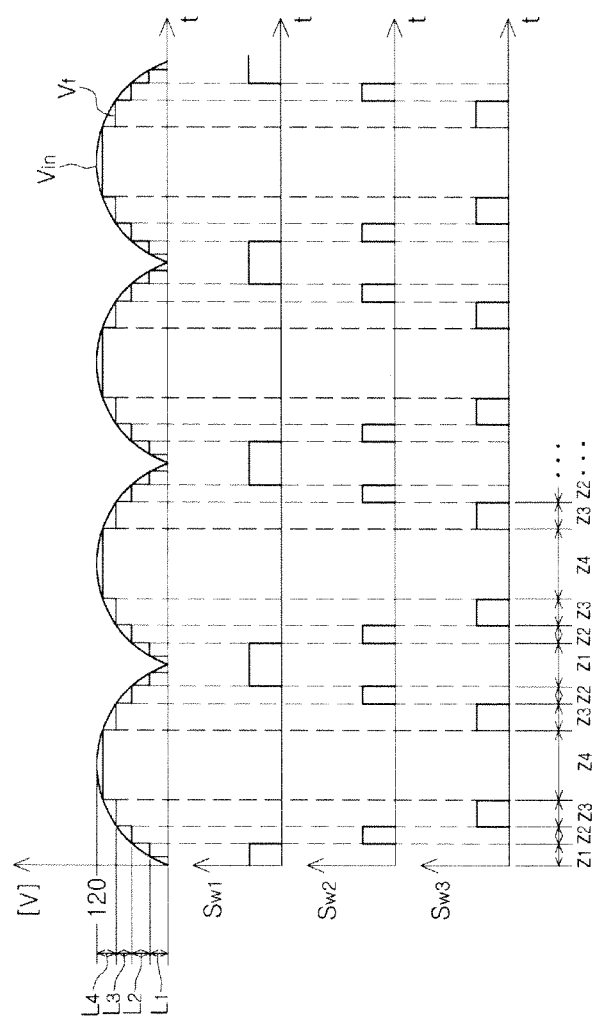

In detail, with reference to FIG. 6B together with 6A, the driving switching controller divides a magnitude of a driving voltage Vin changing over time into four voltage level ranges L1 to L4, and applies an ON switching signal to the first driving switch $S_{w1}$ during a section (first section z1) in which the magnitude of the driving voltage Vin corresponds to the first voltage level range L1 which is lowest. In this case, during the first section z1, the first light emitting group G1 is driven and the second to fourth light emitting groups G2 to G4 are not driven.

Also, during a section (second section z2) corresponding to the second voltage level range L2, the driving switching controller applies an ON switching signal to the second driving switch $S_{w2}$, and in this case, during the second section z2, the first and second light emitting groups G1 and G2 are driven and the third and fourth light emitting group G3 and G4 are not driven. Similarly, during a section (third section z3) corresponding to the third voltage level range L3, the driving switching controller applies an ON switching signal to the third driving switch $S_{w3}$, and in this case, during the third section z3, the first to third light emitting groups G1 to G3 are driven and the fourth light emitting group G4 is not driven. Similarly, during a section (fourth section z4) corresponding to the fourth voltage level range L4, the driving switching controller switches off all of the first to third driving switches $S_{w1}$, $S_{w2}$, and $S_{w3}$, and in this case, all of the first to fourth light emitting groups G1 to G4 may be driven.

At a point in time at which a magnitude of the driving voltage Vin changing over time is sufficient for driving only a portion of LEDs due to the threshold voltage Vf characteristics of the plurality of LEDs provided in the light source unit 300', only a portion of the LEDs is driven to promote improvement of driving efficiency of the LEDs provided in the light source unit 300'.

In addition, the light source driving apparatus according to the present exemplary embodiment, when the peak value of the driving voltage is changed (for example, in a case in which the commercial AC voltage of 120V amplitude from the external power source 100 is changed to a commercial AC voltage of 220V amplitude), a connection structure of the plurality of LEDs constituting each of the light emitting groups may be changed to change a threshold voltage of each of the light emitting groups.

Figure 7A:
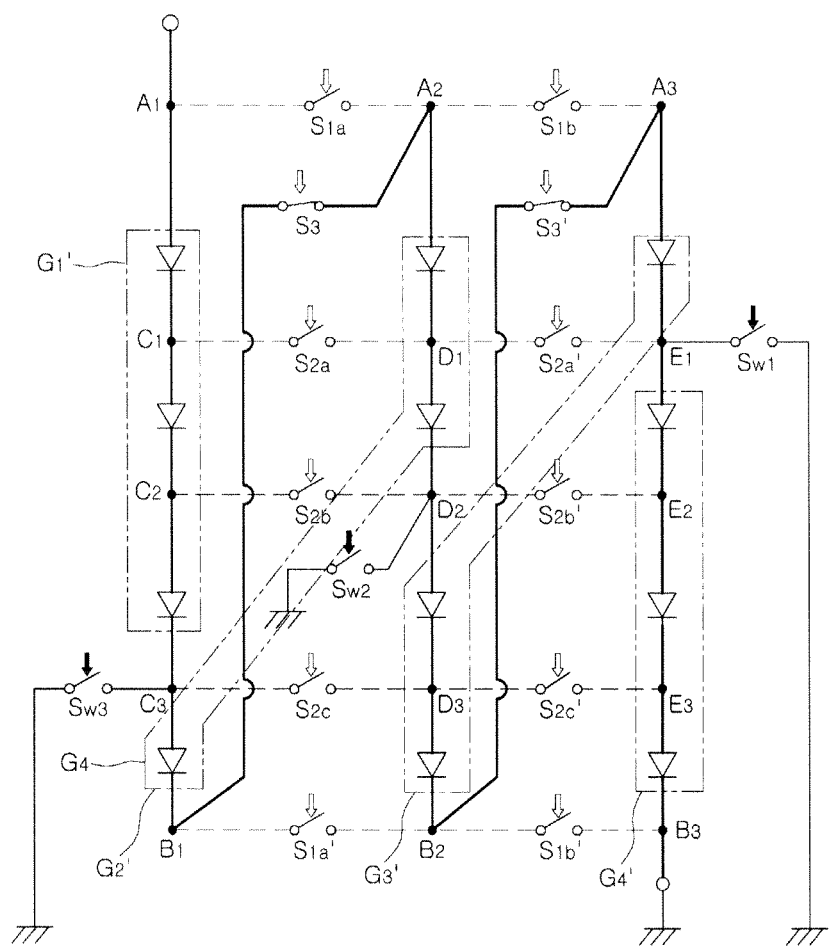

In detail, when a peak value of the driving voltage is greater than a pre-set value, the driving switching controller may switch ON the third connection switches $S_3$ and $S_3'$ and switch OFF a plurality of first and second connection switches $S_{1a}$, $S_{1b}$, $S_{1a'}$, $S_{1b'}$, $S_{2a}$, $S_{2b}$, $S_{2c}$, $S_{2a'}$, $S_{2b'}$, $S_{2c'}$, $S_3$, and $S_3'$ as illustrated in FIG. 7A.

Accordingly, a connection structure among the first to third LED arrays 10, 20, and 30 may be a series connection, and the light source unit 300' is classified as including first to fourth light emitting groups G1' to G4' and the number of light emitting groups driven at any point in time is controlled according to ON/OFF switching of the driving switches $S_{w1}$, $S_{w2}$, and $S_{w3}$. Here, each of the first to fourth light emitting groups G1' to G4' has a connection structure in which at least two or more light emitting elements among the first to third LEDs are connected in series.

In detail, as illustrated in FIG. 7A, the first light emitting group G1' has a connection structure in which first to third light emitting elements among the plurality of first LEDs are connected in series. The second light emitting group G2' has a connection structure in which a fourth light emitting element among the plurality of first LEDs and first and second light emitting elements among the plurality of second LEDs are connected in series. The third light emitting group G3' has a connection structure in which third and fourth light emitting elements among the plurality of second LEDs and a first light emitting element among the plurality of third LEDs are connected in series. The fourth light emitting group G4' has a connection structure in which second to fourth light emitting elements among the plurality of third LEDs are connected in series.

In the present exemplary embodiment, the first to third driving switches $S_{w1}$, $S_{w2}$, and $S_{w3}$ may control the number of light emitting groups that are driven among the first to fourth light emitting groups G1' to G4' through ON/OFF switching.

In detail, referring to FIG. 7B together with 7A, during a section (first section z1') corresponding to a first voltage level range L1' at which the driving voltage Vin is lowest, the driving switching controller applies an ON switching signal to the third driving switch $S_{w3}$. Similarly, during a section (second and third sections z2' and z3') corresponding to second and third voltage level ranges L2' and L3', the driving switching controller applies an ON switching signal to the second driving switch $S_{w2}$ and the first driving switch $S_{w1}$, respectively. During a section (fourth section z4') corresponding to a fourth voltage level range L4', the driving switching controller switches OFF all of the first to third driving switches $S_{w1}$, $S_{w2}$, and $S_{w3}$, and in this case, all of the first to fourth light emitting groups G1' to G4' may be driven.

According to the exemplary embodiments as described above, driving efficiency of the LEDs provided in the light source unit 300' is improved. In this case, since there is no need to newly design a connection structure of the light source unit 300' no matter which amplitude of commercial AC voltage is provided by the external power source connected to drive the light emitting device, compatibility and convenience may be improved.

Figure 8:
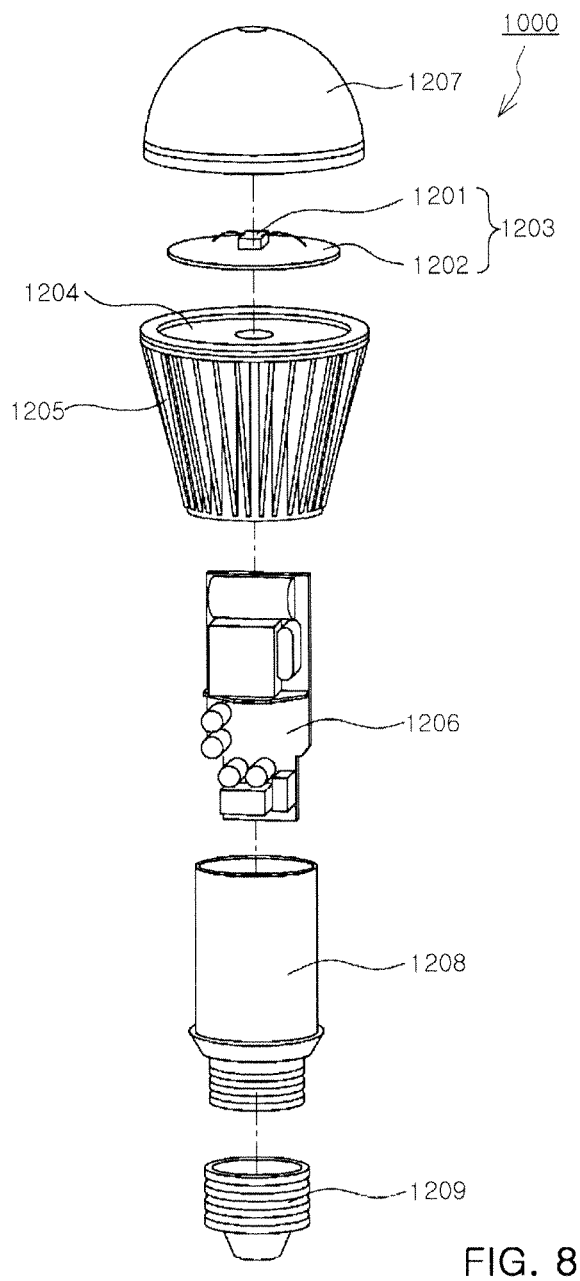
FIGS. 8 and 9 are exploded perspective views illustrating examples of light emitting devices according to an exemplary embodiment of the present disclosure.
Figure 9:
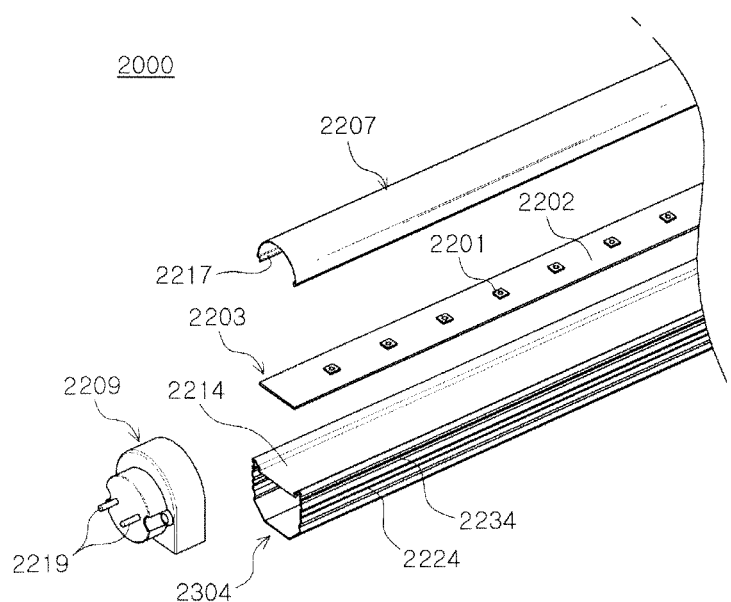

FIGS. 8 and 9 are exploded perspective views illustrating an example of implementing a light emitting device in a lighting device according to an exemplary embodiment of the present disclosure.

The lighting device may be a bulb-type lamp as illustrated in FIG. 8. The lighting device may have a shape similar to that of an incandescent bulb to replace a conventional incandescent bulb, and may emit light having optical characteristics (a color, a color temperature, and the like) similar to those of an incandescent bulb, but the present disclosure is not limited thereto.

Referring to the exploded perspective view of FIG. 8, the lighting device 1000 includes a light source unit 1203, a driving unit 1206, and an external connection unit 1209. Also, the lighting device 1000 may further include external structures such as external and internal housings 1205 and 1208 and a cover unit 1207. The light source unit 1203 may include an LED 1201 and a circuit board 1202 on which the LED 1201 is mounted. In the present embodiment, the driving unit 1206 may include the driving controller and the connection controller described above in the former exemplary embodiment and may be understood to correspond to the light source driving apparatus described above in the former exemplary embodiment.

Also, in the lighting device 1000, the light source unit 1203 may include an external housing 1205 serving as a heat dissipation unit, and the external housing 1205 may include a heat dissipation plate 1204 disposed to be in direct contact with the light source unit 1203 to enhance a heat dissipation effect. Also, the lighting device 1000 may include the cover unit 1207 installed on the light source unit 1203 and having a convex lens shape. The driving unit 1206 may be installed in the internal housing 1208 and connected to the external connection unit 1209 having a socket structure to receive driving power from the outside.

A lighting device 2000 including a light emitting device according to an exemplary embodiment of the present disclosure may be a bar-type lamp as illustrated in FIG. 9. The lighting device 2000 may have a shape similar to that of a fluorescent lamp to replace a conventional fluorescent lamp, and may emit light having optical characteristics (color, color temperature, and the like) similar to those of a fluorescent lamp, but the present disclosure is not limited thereto.

Referring to the exploded perspective view of FIG. 9, the lighting device 2000 according to the present exemplary embodiment may include a light source unit 2203, a body unit 2304, and a driving unit 2209. The lighting device 2000 may further include a cover unit 2207 covering the light source unit 2203.

The light source unit 2203 may include a board 2202 and a plurality of LEDs 2201 mounted on the board 2202.

The body unit 2304 may allow the source unit 2203 to be fixed to one surface thereof. The body unit 2304, a type of support structure, may include a heat sink. The body unit 2304 may be formed of a material having excellent heat conductivity to dissipate heat generated by the light source unit 2203 outwardly. For example, the body unit 2304 may be formed of a metal, but the present disclosure is not limited thereto.

The body unit 2304 may have an elongated bar-like shape corresponding to the shape of the board 2202 of the light source unit 2202 on the whole. The body unit 2304 may have a recess 2214 formed in one surface thereof to accommodate the light source unit 2203 therein.

A plurality of heat dissipation fins 2224 may be protruded from at least one outer surface of the body unit 2304 to dissipate heat. Stopping recesses 2234 may be formed in at least one end of the outer surface positioned in an upper portion of the recess 2214, and extend in a length direction of the body unit 2304. The cover unit 2207 as described hereinafter may be fastened to the stopping recesses 2234.

At least one of end portions of the body unit 2304 in the length direction thereof may be open, so the body unit 2304 may have a pipe structure with at least end portion thereof open.

The driving unit 2209 may be provided on at least one open side of at least one end portion of the body unit 2304 in the length direction to supply driving voltage to the light source unit 2203. In the present exemplary embodiment, it is illustrated that at least one end portion of the body unit 2304 is open, so the driving unit 2209 is disposed in at least one end portion of the body unit 2304. In the present exemplary embodiment, the driving unit 2209 may include the driving controller and the connection controller described above in the former exemplary embodiment, and may be understood to correspond to the light source driving apparatus described above in the former exemplary embodiment.

The driving unit 2209 may be fastened to at least one open end portion of the body unit 2304 to cover the same. The driving unit 2209 may include electrode pins 6019 protruded outwardly.

The cover unit 2207 may be fastened to the body unit 2304 to cover the light source unit 2203. The cover unit 2207 may be formed of a material allowing light to be transmitted therethrough.

The cover unit 2207 may have a curved surface having a semicircular shape to allow light to be uniformly irradiated outwardly on the whole. A protrusion 2217 may be formed in a length direction of the cover unit 2207 on the bottom of the cover unit 2207 fastened to the body unit 2304, and engaged with the stopping recess 2234 of the body unit 2304.

In the present exemplary embodiment, the cover unit 2207 has a semicircular shape, but the present disclosure is not limited thereto. For example, the cover unit 2207 may have a flat quadrangular shape or may have any other polygonal shape. The shape of the cover unit 2207 may be variously modified according to a design of illumination for irradiating light.

Hereinafter, an LED applicable to the lighting device according to the present exemplary embodiment will be described with reference to FIGS. 10, 11, 12, 13A-13E, and 14.

First LED Example

Figure 10:
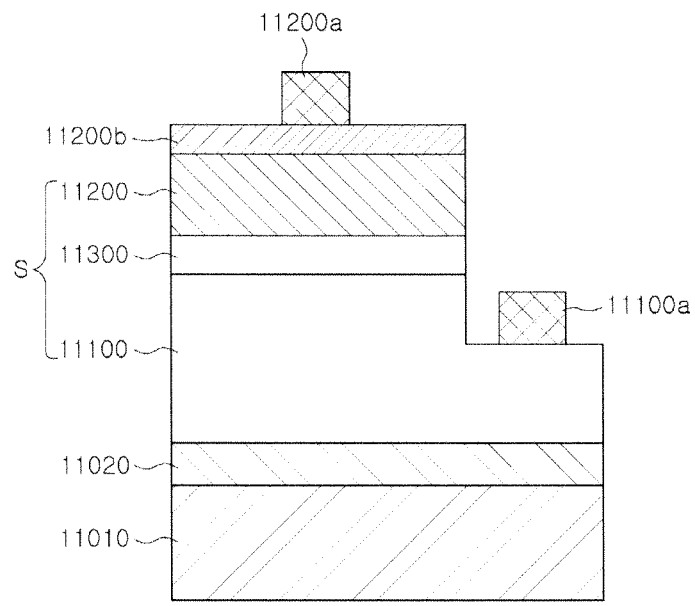
FIGS. 10, 11, 12, 13A-13E, and 14 are views illustrating light emitting diodes (LEDs) employable in a light emitting device according to an exemplary embodiment of the present disclosure.

First, referring to FIG. 10, an LED according to an exemplary embodiment of the present disclosure may be provided as an LED chip including a light emitting laminate S formed on a semiconductor substrate 11010.

An insulating substrate, a conductive substrate, or a semiconductor substrate may be used as the substrate 11010, as needed. For example, the substrate 11010 may be formed of sapphire, SiC, Si, $MgAl_2O_4$, MgO, $LiAlO_2$, $LiGaO_2$, GaN, AlN, or AlGaN. Thereamong, a sapphire substrate, a silicon carbide (SiC) substrate, or the like, is commonly used as a heterogeneous substrate. In the case of a sapphire substrate, sapphire is formed of a crystal having Hexa-Rhombo R3c symmetry, of which lattice constants in c-axis and a-axis directions are approximately 13.001 Å and 4.758 Å, respectively, and has a C-plane (0001), an A-plane (11-20), an R-plane (1-102), and the like. In this case, a nitride thin film may be relatively easily grown on the C-plane of the sapphire crystal, and because sapphire crystal is stable at high temperatures, the sapphire substrate is commonly used as a nitride growth substrate.

A silicon (Si) substrate may also be employed as a heterogeneous substrate. Since the Si substrate is more appropriate for increasing a diameter and is relatively low in price, the Si substrate may be used to facilitate mass-production. A technique of inducing a difference in lattice constants between the silicon substrate having a (111) plane as a substrate surface and GaN to a degree of 17% to thereby suppress the generation of crystal defects due to the difference between the lattice constants is required. Also, a difference in coefficients of thermal expansion between silicon and GaN is approximately 56%, requiring a technique of suppressing bowing of a wafer generated due to the difference in the coefficients of thermal expansion. Bowed wafers may result in cracks in the GaN thin film and make it difficult to control processes to increase dispersion of emission wavelengths of light in the same wafer, or the like. The Si substrate absorbs light generated in GaN-based semiconductor, lowering external quantum efficiency of the LED. Thus, the substrate 11010 may be removed and a support substrate such as a silicon substrate, a germanium substrate, an SiAl substrate, a ceramic substrate, a metal substrate, or the like, including a reflective layer, may be additionally formed to be used, as necessary.

The substrate 11010 of the LED employed in the present exemplary embodiment is not limited to a heterogeneous substrate, and a GaN substrate, a homogeneous substrate, may also be used. A GaN substrate does not have a high degree of mismatch with a GaN material used to form the light emitting laminate S in terms of a lattice constant and a coefficient of thermal expansion, thus allowing for a high quality semiconductor thin film to be grown thereon.

Meanwhile, in the case of using a heterogeneous substrate, defects such as dislocation may be increased due to a difference in lattice constants between a substrate material and a thin film material. Also, a difference in coefficients of thermal expansion between the substrate material and the thin film material causes bowing of the substrate when a temperature is changed, and the bowing of the substrate may cause cracks in the thin film. These problems may be reduced by using a buffer layer 11020 formed between the substrate 11010 and the GaN-based light emitting laminate S.

Thus, in the present exemplary embodiment, the LED may further include the buffer layer 11020 formed between the substrate 11010 and the light emitting laminate S. The buffer layer 11020 may serve to adjust a degree of bowing of the substrate 11010 when an active layer 11300 is grown, to thereby reduce wavelength scattering of a wafer.

Although differing according to substrate type, the buffer layer 1102 may be formed of $Al_xIn_yGa_{1-x-y}N$ ($0 \le x \le 1$, $0 \le y \le 1$), in particular, GaN, AlN, AlGaN, InGaN, or InGaAlN, and a material such as $ZrB_2$, $HfB_2$, ZrN, HfN, TiN, or the like, may also be used as necessary. Also, the buffer layer 11020 may be formed by combining a plurality of layers or by gradually changing a composition.

Also, in case of employing a silicon substrate as the substrate 11010, silicon has a coefficient of thermal expansion significantly different (by about 56%) from that of GaN. Thus, in case of growing a GaN-based thin film on the silicon substrate, when a GaN thin film is grown at a high temperature and is subsequently cooled to room temperature, tensile stress is applied to the GaN thin film due to the difference in the coefficients of thermal expansion between the silicon substrate and the GaN thin film, generating cracks. In this case, in order to prevent the generation of cracks, a method of growing the GaN thin film such that compressive stress is applied to the GaN thin film while the GaN thin film is being grown is used to compensate for tensile stress. In addition, in order to restrain the generation of defects due to a difference in lattice constants, the buffer layer 11020 having a composite structure may be used. In this case, the buffer layer 11020 may serve to control stress for suppressing warpage (or bowing) as well as controlling defects.

For example, first, an AlN layer is formed as the buffer layer 11020 on the substrate 1101. In this case, a material not including gallium (Ga) may be used in order to prevent a reaction between silicon (Si) and gallium (Ga). The AlN layer is grown at a temperature ranging from 400° C. to 1,300° C. by using an aluminum (Al) source and a nitrogen (N) source. Here, an AlGaN intermediate layer may be inserted into the center of GaN between the plurality of AlN layers to control stress, as necessary, to form the buffer layer 11020 having a composite structure.

Meanwhile, the substrate 11010 may be completely or partially removed or patterned during a fabrication process in order to enhance optical properties or electrical characteristics of the LED before or after the light emitting laminate S is grown. For example, in the case of a sapphire substrate, the substrate may be separated by irradiating a laser onto an interface between the substrate 11010 and the buffer layer 11020 or on an interface between the substrate 11010 and the light emitting laminate S, and in case of a silicon substrate or a silicon carbide substrate, the substrate may be removed through a method of polishing/etching, or the like.

Also, in removing the substrate 11010, a different support substrate may be used, and in this case, the support substrate may be attached to the opposite side of the original growth substrate by using a reflective metal, or a reflective structure may be inserted into a middle portion of a bonding layer to enhance light efficiency of the LED.

Referring to substrate patterning, an uneven surface or a sloped surface may be formed on a main surface (one surface or both surfaces) or a lateral surface of the substrate 11010 before or after the growth of the light emitting laminate S to enhance light extraction efficiency. A size of the pattern may be selected from within a range of 5 nm to 500 μm, and any pattern may be employed, as long as it can enhance light extraction efficiency as a regular or an irregular pattern. The pattern may have various shapes such as a columnar shape, a peaked shape, a hemispherical shape, a polygonal shape, and the like.

The light emitting laminate S includes first and second conductivity-type semiconductor layers 11100 and 11200 and the active layer 11300 interposed therebetween. The first and second conductivity-type semiconductor layers 11100 and 11200 may have a single layer structure, or, alternatively, the first and second conductivity-type semiconductor layers 11100 and 11200 may have a multilayer structure including layers having different compositions, thicknesses, and the like, as necessary. For example, the first and second conductivity-type semiconductor layers 11100 and 11200 may have a carrier injection layer for improving electron and hole injection efficiency, or may have various types of superlattice structure, respectively.

The first conductivity-type semiconductor layer 11100 may further include a current spreading layer in a region adjacent to the active layer 11300. The current spreading layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 11200 may further include an electron blocking layer in a region adjacent to the active layer 11300. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 11300, thus preventing electrons from being transferred to the second conductivity-type (e.g., p-type) semiconductor layer 11200.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied to a reaction container in which the substrate 11010 is installed as reactive gases, the substrate 11010 is maintained at a high temperature ranging from 900° C. to 1,100° C., and while a gallium nitride-based compound semiconductor is being grown, an impurity gas is supplied as necessary to laminate the gallium nitride-based compound semiconductor as an undoped n-type or p-type semiconductor. Silicon (Si) is a well known n-type impurity. P-type impurities include zinc (Zn), cadmium (Cd), beryllium (Be), magnesium (Mg), calcium (Ca), barium (Ba), and the like, and among them, magnesium (Mg) and zinc (Zn) are commonly used.

Also, the active layer 11300 disposed between the first and second conductivity-type semiconductor layers 11100 and 11200 may have a multi-quantum well (MQW) structure in which quantum well layers and quantum barrier layers are alternately laminated. For example, in the case of a nitride semiconductor, a GaN/InGaN structure may be used, or a single quantum well (SQW) structure may also be used.

In the present exemplary embodiment, an ohmic-contact layer 11200b may be formed on the second conductivity-type semiconductor layer 11200. The ohmic-contact layer 11200b may have a relatively high impurity concentration to have low ohmic-contact resistance to lower an operating voltage of the element and enhance element characteristics. The ohmic-contact layer 11200b may be formed of a GaN layer, a InGaN layer, a ZnO layer, or a graphene layer.

First or second electrodes 11100a and 11200a electrically connected to the first and second conductivity-type semiconductor layers 11100 and 11200, respectively, may be formed of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

The LED illustrated in FIG. 10 may have a structure in which the first and second electrodes 11100a and 11200a face in the same direction as that of a light extraction surface, for example. However, conversely, the first and second electrodes 11100a and 11200a may also be mounted to face in a direction opposite to the light extraction surface in a flip-chip structure.

Second LED Example

Figure 11:
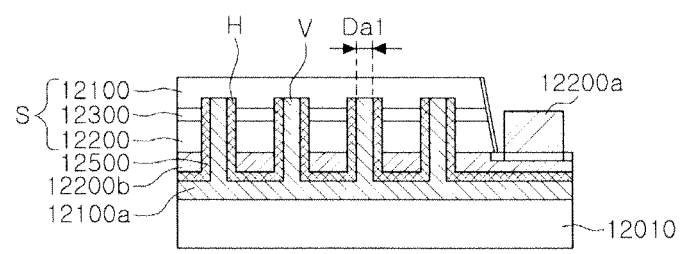

FIG. 11 illustrates a different type LED employable according to an exemplary embodiment of the present disclosure.

In the case of an LED according to the exemplary embodiment of FIG. 11, current spreading efficiency and heat dissipation efficiency may be enhanced, and high output, large LED may be obtained.

Referring to FIG. 11, the LED according to the present exemplary embodiment may include a light emitting laminate S having a first conductivity-type semiconductor layer 12100, an active layer 12300, and a second conductivity-type semiconductor layer 12200 sequentially laminated therein, a second electrode layer 12200b, an insulating layer 12500, a first electrode layer 12100a, and a substrate 12010. Here, in order to be electrically connected to the first conductivity-type semiconductor layer 12100, the first electrode layer 12100a includes one or more contact holes H extending from one surface of the first electrode layer 12100a to at least a partial region of the first conductivity-type semiconductor layer 12100 and electrically insulated from the second conductivity-type semiconductor layer 12200 and the active layer 12300. However, the first electrode layer 12100a is not an essential element in the present exemplary embodiment.

The contact hole H may extend from an interface of the first electrode layer 12100a, passing through the second electrode layer 12200b, the second conductivity-type semiconductor layer 12200, and the active layer 12300, to the interior of the first conductivity-type semiconductor layer 12100. The contact hole H may extend at least to an interface between the active layer 12300 and the first conductivity-type semiconductor layer 12100 and, preferably, extend to a portion of the first conductivity-type semiconductor layer 12100. However, the contact hole H may be formed for electrical connectivity and current spreading of the first conductivity-type semiconductor layer 12100, so the purpose of the presence of the contact hole H is achieved when it is in contact with the first conductivity-type semiconductor layer 12100. Thus, it is not necessary for the contact hole H to extend to an external surface of the first conductivity-type semiconductor layer 12100.

The second electrode layer 12200b formed on the second conductivity-type semiconductor layer 12200 may be selectively formed of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 12200, and may be formed by using a process such as sputtering, deposition, or the like.

The contact hole H may penetrate the second electrode layer 12200b, the second conductivity-type semiconductor layer 12200, and the active layer 12300 so as to be connected to the first conductivity-type semiconductor layer 12100. The contact hole H may be formed through an etching process, e.g., inductively coupled plasma-reactive ion etching (ICP-RIE), or the like.

The insulating layer 12500 is formed to cover a side wall of the contact hole H and a surface of the second conductivity-type semiconductor layer 12200. In this case, at least a portion of the first conductivity-type semiconductor layer 121000 corresponding to a lower surface of the contact hole H may be exposed. The insulating layer 12500 may be formed by depositing an insulating material such as $SiO_2$, $SiO_xN_y$, or $Si_xN_y$.

The second electrode layer 12200b including a conductive via formed by filling a conductive material is formed within the contact hole H. Subsequently, the substrate 12010 is formed on the second electrode layer 12200b. In this structure, the substrate 12010 may be electrically connected by the conductive via connected to the first conductivity-type semiconductor layer 12100.

The substrate 12010 may be formed of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like. But the present disclosure is not limited thereto.

In order to reduce contact resistance, the amount, shape, and pitch of the contact hole H, a contact area of the contact hole H with the first and second conductivity-type semiconductor layers 12100 and 12200, and the like, may be appropriately regulated. The contact holes H may be arranged to have various shapes in rows and columns to improve current flow. In this case, the conductive via may be surrounded by the insulating layer 12500 so as to be electrically separated from the active layer 12300 and the second conductivity-type semiconductor layer 12200.

The amount of vias V and contact areas thereof may be adjusted such that the area of the plurality of vias V in rows and columns occupying the plane of the regions in which they are in contact with the first conductivity-type semiconductor ranges from 1% to 5% of the planar area of the light emitting laminate S. A radius (half (½) of the diameter Da1) of the via may range, for example, from 5 μm to 50 μm, and the number of vias V may be 1 to 50 per light emitting device region according to a width of the light emitting region. Although different according to a width of the light emitting device region, two or more vias may be provided. A distance between the vias V may range from 100 um to 500 um, and the vias V may have a matrix structure including rows and columns. Preferably, the distance between the vias may range from 150 um to 450 um. If the distance between the vias is smaller than 100 um, the amount of vias V is increased to relatively reduce a light emitting area to lower luminous efficiency, and if the distance between the vias is greater than 500 um, current spreading suffers to degrade luminous efficiency. A depth of the conductive via V may range from 0.5 μm to 5.0 μm although the depth of the conductive via V may vary according to a thickness of the second conductivity-type semiconductor layer 12200 and the active layer 12300.

Third LED Example

Figure 12:
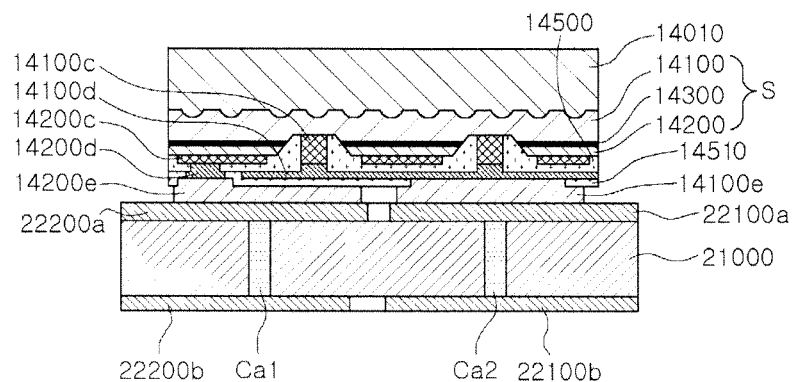

FIG. 12 illustrates an example of an LED employed in a form different from that of the foregoing example.

Referring to FIG. 12, an LED may include a light emitting laminate S disposed in one surface of a substrate 14010 and first and second electrodes 14100c and 14200c disposed on the opposite side of the substrate 14100 based on the light emitting laminate S. In addition, the LED may include an insulating unit 14500 covering the first and second electrodes 14100c and 14200c. The first and second electrodes 14100c and 14200c may be electrically connected to first and second electrode pads 14100e and 14200e by electrical connection units 14100d and 14200d.

The light emitting laminate S may include a first conductivity-type semiconductor layer 14100, an active layer 14300, and a second conductivity-type semiconductor layer 14200 sequentially disposed on the substrate 14010. The first electrode 14100c may be provided as a conductive via connected to the first conductivity-type semiconductor layer 14100 through the second conductivity-type semiconductor layer 14200 and the active layer 14300. The second electrode 14200c may be connected to the second conductivity-type semiconductor layer 14200.

The insulating unit 14500 has an open area exposing at least portions of the first and second electrodes 14100c and 14200c, and the first and second electrode pads 14100e and 14200e may be connected to the first and second electrodes 14100c and 14200c.

The first and second electrodes 14100c and 14200c may be formed of a conductive material having ohmic characteristics with respect to the first conductivity-type semiconductor layers 14100 and 14200, respectively, and may have a single layer structure or a multilayer structure. For example, the first and second electrodes 14100c and 14200c may be formed by depositing or sputtering one or more of silver (Ag), aluminum (Al), nickel (Ni), chromium (Cr), a transparent conductive oxide (TCO), and the like. The first and second electrodes 14100c and 14200c may be disposed in the same direction and may be mounted as a so-called flip-chip on a lead frame, or the like, as described hereinafter. In this case, the first and second electrodes 14100c and 14200c may be disposed to face in the same direction.

In particular, the first electrode 14100c may have a conductive via connected to the first conductivity-type semiconductor layer 14100 through the second conductivity-type semiconductor layer 14200 and the active layer 14300 within the light emitting laminate S, and may be electrically connected to a first electrical connection unit 14100d.

The LED may include the second electrode 14200c formed directly on the second conductivity-type semiconductor layer 14200 and a second electrical connection unit 14200d formed on the second electrode 14200c. In addition to having the function of forming electrical-ohmic connection with the second conductivity-type semiconductor layer 14200, the second electrode 14200c may be formed of a light reflective material, whereby, as illustrated in FIG. 12, in a state in which the LED is mounted as a so-called flip chip structure, light emitted from the active layer 14300 may be effectively emitted toward the substrate 14010. The second electrode 14200c may be formed of a light-transmissive conductive material such as a transparent conductive oxide, according to a main light emitting direction.

In addition, on the basis of the second conductivity-type semiconductor layer 14200, an ohmic-electrode of an Ag layer may be laminated as the second electrode 14200c. The Ag ohmic-electrode also serves as a light reflective layer. A single layer of nickel (Ni), titanium (Ti), platinum (Pt), or tungsten (W) or an alloy layer thereof may be alternately laminated on the Ag layer. In detail, Ni/Ti layers, TiW/Pt layers, or Ti/W layers may be laminated or these layers may be alternately laminated on the Ag layer. As for the first electrode 14100c, on the basis of the first conductivity-type semiconductor layer 14100, a chromium (Cr) layer may be laminated and Au/Pt/Ti layers may be sequentially laminated on the Cr layer, or on the basis of the first conductivity-type semiconductor layer 14100, an Al layer may be laminated and Ti/Ni/Au layers may be sequentially laminated on the Al layer.

In order to enhance ohmic characteristics or reflecting characteristics, the first and second electrodes 14100c and 14200c may employ various materials or lamination structures other than those of the foregoing exemplary embodiments.

The two electrode structures as described above may be electrically separated by the insulating unit 14500. The insulating unit 14500 may be formed of any material as long as it has electrically insulating properties. Preferably, a material having a low degree of light absorption may be used. For example, a silicon oxide or a silicon nitride such as $SiO_2$, $SiO_xN_y$, $Si_xN_y$, or the like, may be used. If necessary, a light reflective filler may be dispersed in the light-transmissive material to form a light reflective structure.

The first and second electrode pads 14100e and 14200e may be connected to the first and second electrical connection units 14100d and 14200d to serve as external terminals of the LED, respectively. Here, an insulating material layer 14510 may be disposed in partial regions between the first and second electrical connection units 14100d and 14200d and the first and second electrode pads 14100e and 14200e. The first and second electrode pads 14100e and 14200e may be formed of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED is mounted on the substrate 14010, the first and second electrode pads 14100e and 14200e may be bonded by using the eutectic metal, so solder bumps generally required for flip chip bonding may not be used. The use of a eutectic metal in the mounting method advantageously obtains superior heat dissipation effects in comparison to the use of solder bumps. In this case, in order to obtain excellent heat dissipation effects, the first and second electrode pads 14100e and 14200e may be formed to occupy a relatively large area.

Also, a buffer layer may be formed between the light emitting structure S and the substrate 1401. The buffer layer may be employed as an undoped semiconductor layer formed of a nitride, or the like, to alleviate lattice defects in the light emitting structure grown thereon.

In the present exemplary embodiment, the substrate 14010 may have first and second main surfaces opposing one another, and an uneven structure (e.g., a depression and protrusion pattern) may be formed on at least one of the first and second main surfaces. The uneven structure formed on one surface of the substrate 14010 may be formed by etching a portion of the substrate 14010. The uneven structure may be formed of the same material as that of the substrate 14010. Alternatively, the uneven structure may be formed of a heterogeneous material different from that of the substrate 14010.

In the present exemplary embodiment, since the uneven structure is formed on the interface between the substrate 14010 and the first conductivity-type semiconductor layer 14100, paths of light emitted from the active layer 14300 may be of diversity, and thus, a light absorption ratio of light absorbed within the semiconductor layer may be reduced and a light scattering ratio may be increased, whereby light extraction efficiency may be increased.

In detail, the uneven structure may be formed to have a regular or irregular shape. The heterogeneous material used to form the uneven structure may be a transparent conductor, a transparent insulator, or a material having excellent reflectivity. Here, as the transparent insulator, a material such as $SiO_2$, $SiN_x$, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. However, the present disclosure is not limited thereto.

Meanwhile, the substrate 14010 may be removed from the first conductivity-type semiconductor layer 14100. To remove the substrate 14010, a laser lift-off (LLO) process using a laser, an etching process or a polishing process may be used. Also, after the substrate 14010 is removed, depressions and protrusions may be formed on the surface of the first conductivity-type semiconductor layer 14100.

As illustrated in FIG. 12, the LED is mounted on a package body 21000. The package body 21000 may be a semiconductor substrate such as a silicon (Si) substrate, an insulating substrate, or a conductive substrate. Surface electrodes 22100a and 22200a and rear electrodes 22100b and 22200b are formed on upper and lower surfaces of the package body 21000, and conductive vias C1 and C2 are formed to penetrate through the package body 21000 to connect the surface electrodes 22100a and 22200a and the rear electrodes 22100b and 22200b.

In the present exemplary embodiment, the LED may uniformly spread current, and obtain excellent heat dissipation effects in a chip unit since a contact area between the LED and the package body is increased.

Fourth LED Example

In general, when an LED is driven, a partial amount of energy is emitted as thermal energy as well as optical energy. Thus, with a light emitting device employing an LED as a light source, heat dissipation should be considered. The light emitting module generally includes a heat dissipation unit such as a heat sink, or the like, and here, a heating problem may be more effectively improved by using the LED having a low heating value. As the LED meeting such requirements, an LED including, for example, nanostructures (hereinafter, referred to as 'nano-LED') may be used.

Figure 13A:
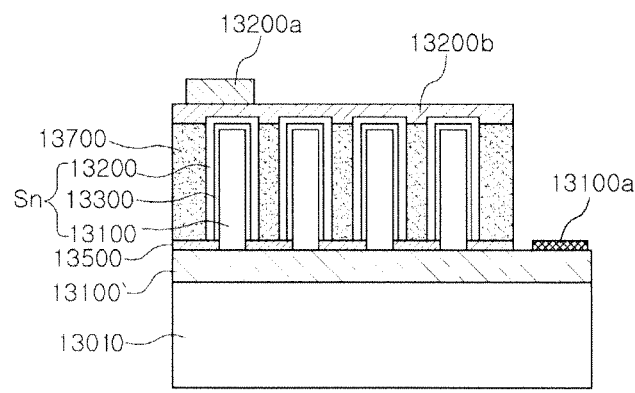

Referring to FIG. 13A, an LED includes a plurality of light emitting nanostructures Sn formed on a substrate 13010. In the present exemplary embodiment, it is illustrated that the light emitting nanostructure Sn has a core-shell structure as a rod structure, but the present disclosure is not limited thereto, and the light emitting nanostructure may have a different structure such as a pyramid structure.

The LED includes a base layer 13100' formed on the substrate 13010. The base layer 13100' is a layer providing a growth surface for the light emitting nanostructure Sn, which may be a first conductivity-type semiconductor layer. A first material layer 13500 having an open area for the growth of the light emitting nanostructure (in particular, a core) may be formed on the base layer 13100'. The first material layer 13500 may be formed of a dielectric material such as $SiO_2$ or $SiN_x$.

In the light emitting nanostructure Sn, a first conductivity-type nanocore 13100 is formed by selectively growing a first conductivity-type semiconductor by using the first material layer 13500 having an open area, and an active layer 13300 and a second conductivity-type semiconductor layer 13200 are formed as shell layers on a surface of the nanocore 13100. Accordingly, the light emitting nanostructure Sn may have a core-shell structure in which the first conductivity-type semiconductor is the nanocore and the active layer 13300 and the second conductivity-type semiconductor layer 13200 enclosing the nanocore are shell layers.

The LED includes a filler material 13700 filling spaces between the light emitting nanostructures Sn. The filler material 13700 may structurally stabilize the light emitting nanostructures Sn. The filler material 13700 may be formed of a transparent material such as $SiO_2$, SiN, or a silicone resin, or a reflective material such as polymer (Nylon), PPA, PCE, silver (Ag), or aluminum (Al), but the present disclosure is not limited thereto. An ohmic-contact layer 13200b may be formed on the light emitting nanostructures Sn and connected to the second conductivity-type semiconductor layer 13200. The LED includes first and second electrodes 13100a and 13200a connected to the base layer 13100' formed of the first conductivity-type semiconductor and the ohmic-contact layer 13200b, respectively.

By forming the light emitting nanostructures Sn such that they have different diameters, components, and doping densities, light having two or more different wavelengths may be emitted from a single device. By appropriately adjusting light having different wavelengths, white light may be implemented in the single device without using phosphors, and light having various desired colors or white light having different color temperatures may be implemented by combining the foregoing device with a different LED or wavelength conversion materials such as phosphors.

The LED using the light emitting nanostructures Sn has increased luminous efficiency by increasing a light emitting area by utilizing the nanostructures, and prevents a degradation of efficiency due to polarization by obtaining a non-polar active layer, thus improving droop characteristics.

FIGS. 13B through 13E are cross-sectional views illustrating major processes of forming light emitting nanostructures Sn using a mask 13502 of a particular example.

Figure 13B:
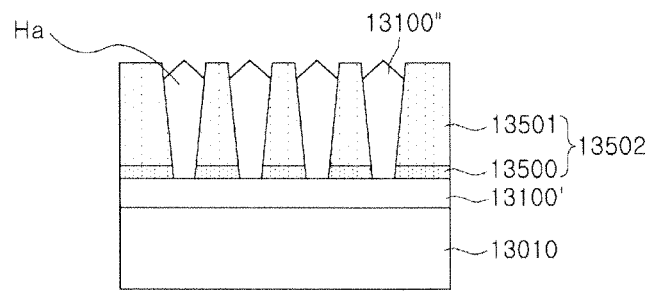

As illustrated in FIG. 13B, nanocores 13100'' may be grown on a base layer 13100' using the mask 13502. The mask 13502 includes a first material layer 13500 and a second material layer 13501 and has openings Ha having a width decreased toward a lower portion thereof.

The first material layer 13500 and the second material layer 13501 may be formed of different materials to secure a desired difference in etching rates. For example, the first material layer 13500 may be formed of SiN, while the second material layer 13501 may be formed of $SiO_2$. Alternatively, the second material layer 13501 or both the first and second material layers 13500 and 13501 are formed of a material having a porous structure to secure a difference in etching rates based on differences in porosity thereof. In this case, the first and second material layers 13500 and 13501 may be formed of the same material but have different porosity.

The nanocores 13100'' may be grown to have a shape corresponding to that of the openings Ha.

In order to further enhance crystal quality of the nanocores 13100'', a heat treatment process may be performed one or more times during the growth of the nanocores 13100''. In particular, a surface of a tip portion of each nanocore 13100'' may be rearranged to have a hexagonal pyramidal crystal face, thus obtaining a stable crystal structure and guaranteeing high quality of a crystal grown in a follow-up process.

The heat treatment process may be performed, for example, at a temperature equal or similar to the growth temperature of the nanocores 13100'', for process convenience. Also, the heat treatment process may be performed in a manner of stopping a metal source such as TMGa, while maintaining pressure and a temperature equal or similar to the growth pressure and temperature of the nanocores 13100''. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process introduced during the growth process of the nanocores 13100'' may prevent degeneration of crystallinity caused when the nanocores 13100'' are grown at a fast speed, and thus, fast crystal growth and excellent crystal quality may be promoted.

A time of a heat treatment process section and the number of heat treatment processes for stabilization may be variously modified according to a height and diameter of final nanocores 13100''. For example, in a case in which a width of each opening ranges from 300 nm to 400 nm and a height of each opening (thickness of the mask 13502) is approximately 2.0 µm, a stabilization time duration ranging from approximately 10 seconds to 60 seconds may be inserted in a middle point, i.e., approximately 1.0 µm, to grow cores having desired high quality. The stabilization process may be omitted according to core growth conditions.

Figure 13C:
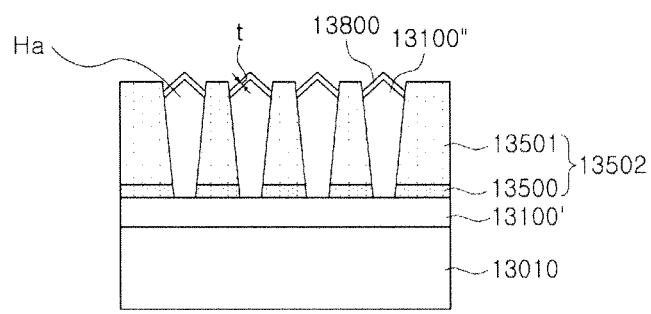

Meanwhile, as illustrated in FIG. 13C, a current suppression intermediate layer 13800, a highly resistive layer, may be formed on tip portions of the nanocores 13100''.

After the nanocores 13100'' are formed to have a desired height, the current suppression intermediate layer 13800 may be formed on the surfaces of the tip portions of the nanocores 13100'' with the mask 13502 retained as is. Thus, the current suppression intermediate layer 13800 may be easily formed in the desired regions (the surfaces of the tip portions) of the nanocores 13100'' without forming an additional mask.

The current suppression intermediate layer 13800 may be a semiconductor layer not doped on purpose or may be a semiconductor layer doped with a second conductivity-type impurity opposite to that of the nanocores 13100''. For example, in a case in which the nanocores 13100'' are n-type GaN, the current suppression intermediate layer 13800 may be undoped GaN or GaN doped with magnesium (Mg) as a p-type impurity. In this case, by changing types of an impurity during the same growth process, the nanocores 13100'' and the current suppression intermediate layer 13800 may be continuously formed. For example, in case of stopping silicon (Si) doping and injecting magnesium (Mg) and growing the same for approximately 1 minute under the same conditions as those of the growth of the n-type GaN nanocores, the current suppression intermediate layer 13800 having a thickness t ranging from approximately 200 nm to 300 nm may be formed, and such a current suppression intermediate layer 13800 may effectively block a leakage current of a few μA or more. In this manner, the current blocking intermediate layer may be simply formed during the mold-type process as in the present exemplary embodiment.

Figure 13D:
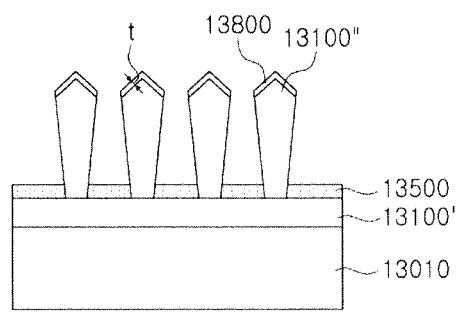

Subsequently, as illustrated in FIG. 13D, portions of the mask layer 13502 to reach the first material layer 13500 as an etch-stop layer are removed to expose lateral surfaces of the plurality of nanocores 13100".

In the present exemplary embodiment, by applying the etching process of selectively removing the second material layer 13501, only the second material layer 13501 may be removed, while the first material layer 13500 may remain. The residual first material layer 13500 may serve to prevent the active layer and the second conductivity-type semiconductor layer from being connected to the base layer 13100' in a follow-up growth process.

In the present exemplary embodiment, an additional heat treatment process may be introduced during the process of forming the light emitting nanostructures using the mask having openings Ha as a mold in order to enhance crystallinity.

Figure 13E:
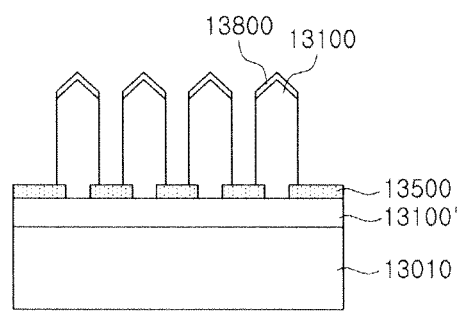

After the second material layer 13501 of the mask 13502 is removed, the surfaces of the nanocores 13100" may be heat-treated under predetermined conditions to change unstable crystal faces of the nanocores 13100" into stable crystal faces. In particular, in the present exemplary embodiment, the nanocores 13100" are grown on the openings Ha having sloped side walls to have the sloped side walls corresponding to the shape of the openings Ha, but as illustrated in FIG. 13E, after the heat treatment process is performed, crystals are rearranged and regrown so the nanocores 13100" may have a substantially uniform diameter (or width). Also, the tip portions of the nanocores 13100" immediately after being grown may have an incomplete hexagonal pyramidal shape, but the nanocores 13100" after the heat treatment process may have a hexagonal pyramidal shape having uniform surfaces. In this manner, the nanocores having a non-uniform width after the removal of the mask 13501 may be regrown (and rearranged) to have a hexagonal pyramidal columnar structure having a uniform width through the heat treatment process.

Meanwhile, LEDs having various structures other than the LED as described above may be used in the light emitting device according to the present exemplary embodiment. For example, an LED in which surface-plasmon polaritons (SPP) is formed in a metal-dielectric interface to interact with a quantum well exciton, thus significantly improving light extraction efficiency, may also be advantageously used.

Fifth LED Example

Figure 14:
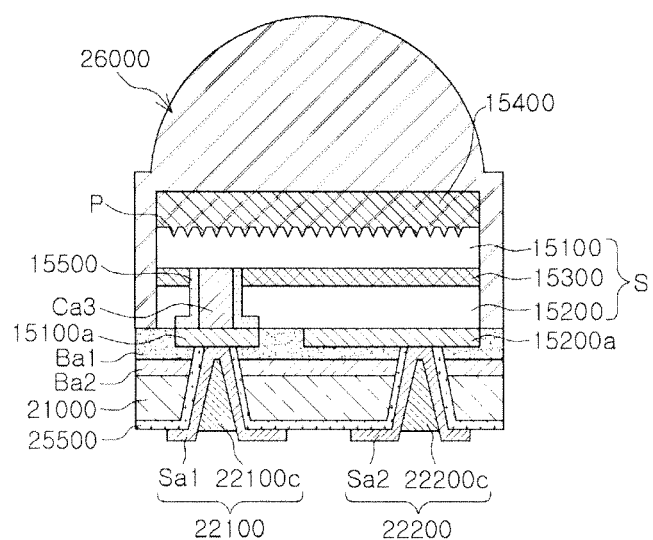

FIG. 14 illustrates an LED implemented as a so-called a chip scale package (CSP), as an LED according to another exemplary embodiment of the present disclosure.

In detail, referring to FIG. 14, the LED according to the present exemplary embodiment may include a light emitting laminate S, a package body 21000 including first and second electrode structures 22100 and 22200, and an LED a lens 26000 disposed above the package body 21000.

The package body 21000 may be a silicon (Si) substrate, a conductive support substrate, or an insulating support substrate having two or more conductive vias. The conductive vias are connected to a first electrode 15100a and a second electrode 15200a of the light emitting laminate S.

The light emitting laminate S has a lamination structure including first and second conductivity-type semiconductor layers 15100 and 15200 and an active layer 15300 disposed therebetween. In the present exemplary embodiment, the first and second conductivity-type semiconductor layers 15100 and 15200 may be p-type and n-type semiconductor layers, respectively, and may be formed of a nitride semiconductor, e.g., $Al_xIn_yGa_{(1-x-y)}N$ ($0 \leq x \leq 1$, $0 \leq y \leq 1$, $0 \leq x+y \leq 1$). However, besides a nitride semiconductor, a GaAs-based semiconductor or GaP-based semiconductor may also be used.

The active layer 15300 formed between the first and second conductivity-type semiconductor layers 15100 and 15200 may emit light having a predetermined level of energy according to electron-hole recombination, and may have a multi-quantum well (MQW) structure in which quantum well layers and quantum barrier layers are alternately laminated. In the case of the MQW structure, for example, an InGaN/GaN or AlGaN/GaN structure may be used.

Meanwhile, the first and second conductivity-type semiconductor layers 15100 and 15200 and the active layer 15300 may be formed by using a semiconductor growth process such as metal-organic chemical vapor deposition (MOCVD), molecular beam epitaxy (MBE), hydride vapor phase epitaxy (HVPE), or the like.

The LED illustrated in FIG. 14 is in a state in which a growth substrate has been removed therefrom, and a depression and protrusion pattern P may be formed on the surface from which the growth substrate was removed.

The LED includes the first and second electrodes 15100a and 15200a connected to the first and second conductivity-type semiconductor layers 15100 and 15200, respectively. The first electrode 15100a includes a conductive via Ca3 connected to the first conductivity-type semiconductor layer 15100 through the second conductivity-type semiconductor layer 15200 and the active layer 15300. An insulating unit 15500 is formed between the conductive via Ca3 and the active layer 15300 and the second conductivity-type semiconductor layer 15200 to prevent a short circuit.

A single conductive via Ca3 is illustrated, but two or more conductive vias Ca3 may be provided and arranged in various forms of rows and columns to promote current spreading.

Like the former exemplary embodiment, on the basis of the second conductivity-type semiconductor layer 15200, an ohmic-electrode of an Ag layer may be laminated as the second electrode 15200a. The Ag ohmic-electrode also serves as a light reflective layer. A single layer of nickel (Ni), titanium (Ti), platinum (Pt), or tungsten (W) or an alloy layer thereof may be alternately laminated on the Ag layer. In detail, Ni/Ti layers, TiW/Pt layers, or Ti/W layers may be laminated or these layers may be alternately laminated on the Ag layer.

As for the first electrode 15100a, on the basis of the first conductivity-type semiconductor layer 15100, a chromium (Cr) layer may be laminated, and Au/Pt layers may be sequentially laminated on the Cr layer, or on the basis of the first conductivity-type semiconductor layer 15100, an Al layer may be laminated and Ti/Ni/Au layers may be sequentially laminated on the Al layer.

In order to enhance ohmic characteristics or reflecting characteristics, the first and second electrodes 15100a and 15200a may employ various materials or lamination structures other than those of the foregoing exemplary embodiments.

The package body 21000 and the LED may be bonded by bonding layers Ba1 and Ba2. The bonding layers Ba1 and Ba2 may be formed of an electrically insulating material or an electrically conductive material. For example, the electrically insulating material may include an oxide such as $SiO_2$ and SiN, a resin material such as a silicone resin and an epoxy resin, or the like, and the electrically conductive material may include silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. This process may be implemented by applying the first and second bonding layers Ba1 and Ba2 to respective bonding surfaces of the LED and the package body 21000 and subsequently bonding them.

A contact hole is formed from a lower surface of the package body 21000 so as to be connected to the first and second electrodes 15100a and 15200a of the LED. An insulator 25500 may be formed on a lateral surface of the contact hole and on a lower surface of the package body 21000. In a case in which the package body 21000 is a silicon substrate, the insulator 25500 may be provided as a silicon oxide film through thermal oxidation. The contact hole is filled with a conductive material to form the first and second electrodes 22100 and 22200 such that they are connected to the first and second electrodes 15100a and 15200a. The first and second electrode structures 22100 and 22200 may include seed layers Sa1 and Sa2 and plating charged units 22100c and 22200c formed through a plating process by using the seed layers Sa1 and Sa2.

The chip-scale package (CSP) as described above and as illustrated in FIG. 14 does not require an additional package, thus reducing a size of the package, and simplifying a manufacturing process is appropriate for mass-production. In addition, an optical structure such as a lens may be integrally manufactured.

Figure 15:
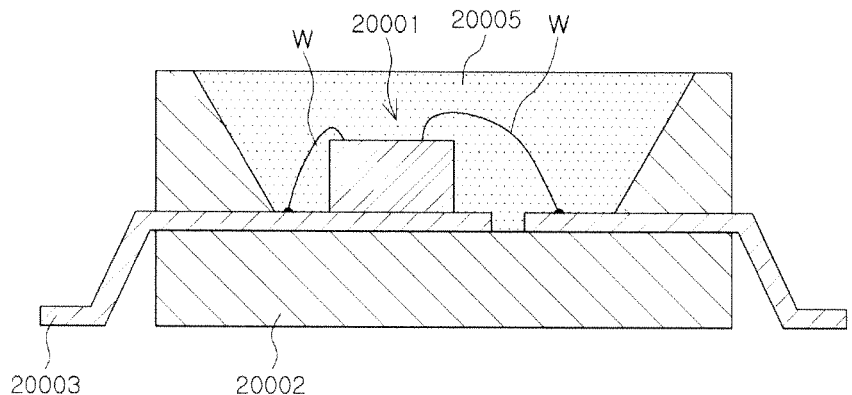
FIGS. 15 and 16 are views illustrating an example of implementing an LED package with an LED employable in a light emitting device according to an exemplary embodiment of the present disclosure.
Figure 16:
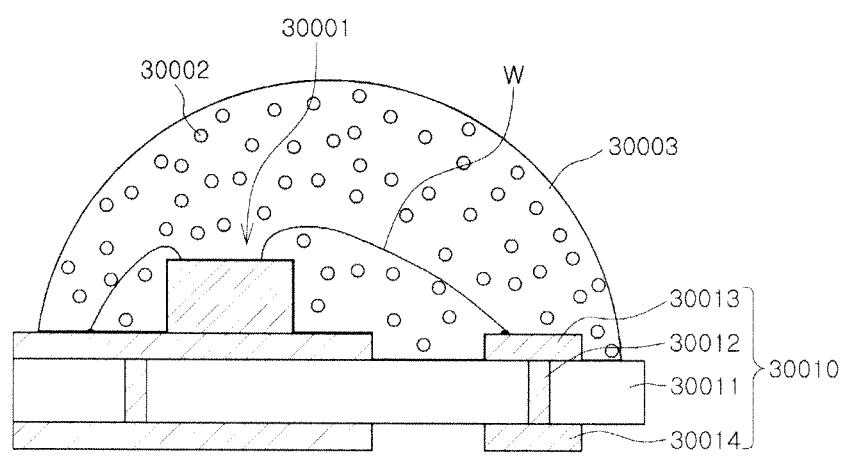

FIGS. 15 and 16 are views illustrating examples of implementing an LED package with an LED employable in a light emitting device according to an exemplary embodiment of the present disclosure.

Referring to FIG. 15, an LED package may include an LED 20001, a package body 20002, and a pair of lead frames 20003. The LED 20001 may be mounted on the lead frame 2003 and electrically connected to the lead frame 20003 through a wire W. According to an exemplary embodiment, the LED 20001 may be mounted on a different region, for example, on the package body 20002, rather than on the lead frame 20003. Also, the package body 20002 may have a cup shape to improve reflectivity efficiency of light. An encapsulant 20005 formed of a light-transmissive material may be formed in the reflective cup to encapsulate the LED 20001, the wire W, and the like.

Referring to FIG. 16, the LED package may include an LED 30001, a mounting board 30010, and an encapsulant 30003. A wavelength conversion unit 30002 may be formed on a surface and lateral surfaces of the LED 30001. The LED 30001 may be mounted on the mounting board 30010 and electrically connected to the mounting board 30010 through a wire W.

The mounting board 30010 may include a board body 30011, an upper electrode 30013, and a lower electrode 30014. Also, the mounting board 30010 may include a through electrode 30012 connecting the upper electrode 30013 and the lower electrode 30014. The mounting board 3010 may be provided as a board such as PCB, MCPCB, MPCB, FPCB, or the like, and the structure of the mounting board 30010 may have various forms.

The wavelength conversion unit 30002 may include a phosphor, a quantum dot, or the like. The encapsulant 30003 may be formed to have a lens structure with an upper surface having a convex dome shape. However, according to an exemplary embodiment, the encapsulant 30003 may have a lens structure having a convex or concave surface to adjust a beam angle of light emitted through an upper surface of the encapsulant 30003.

Meanwhile, the LED may be configured to include at least one of a light emitting device emitting white light by combining yellow, green, red, and orange phosphors with a blue LED chip and a purple, blue, green, red, and infrared light emitting device. In this case, the LED may control a color rendering index (CRI) to range from a sodium-vapor (Na) lamp (40) to a sunlight level (100), or the like, and control a color temperature ranging from 2000K to 20000K to generate various levels of white light. If necessary, the LED may generate visible light having purple, blue, green, red, orange colors, or infrared light to adjust an illumination color according to a surrounding atmosphere or mood. Also, the light emitting device may generate light having a special wavelength stimulating plant growth.

Figure 17:
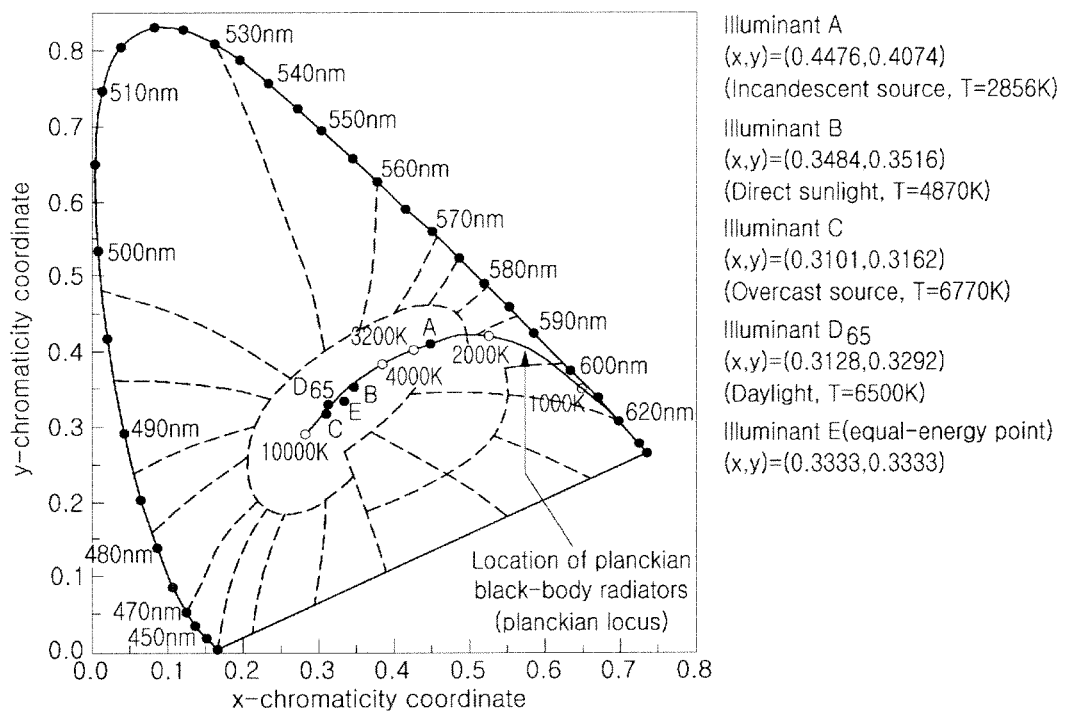
FIG. 17 is a CIE 1931 color space chromaticity diagram.

White light generated by combining yellow, green, red phosphors to a blue LED and/or combining at least one of a green LED and a red LED thereto may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram illustrated in FIG. 17. Alternatively, white light may be positioned in a region surrounded by a spectrum of black body radiation and the segment. A color temperature of white light corresponds to a range from about 2000K to about 20000K.

Phosphors may have the following empirical formula and colors.

In case of oxide-based phosphors, yellow and green phosphors may include a composition of $(Y, Lu, Se, La, Gd, Sm)_3(Ga, Al)_5O_{12}$:Ce, and a blue phosphor may include a composition of $BaMgAl_{10}O_{17}$:Eu, $3Sr_3(PO_4)_2 \cdot CaCl$:Eu.

In case of silicate-based phosphors, yellow and green phosphors may include a composition of $(Ba, Sr)_2SiO_4$:Eu, and yellow and orange phosphors may include a composition of $(Ba, Sr)_3SiO_5$:Eu.

In case of nitride-based phosphors, a green phosphor may include a composition of β-SiAlON:Eu, a yellow phosphor may have a composition of $(La, Gd, Lu, Y, Sc)_3Si_6N_{11}$:Ce, and an orange phosphor may have a composition of α-SiAlON:Eu. A red phosphor may include at least one of compositions among $(Sr, Ca)AlSiN_3$:Eu, $(Sr, Ca)AlSi(ON)_3$:Eu, $(Sr, Ca)_2Si_5N_8$:Eu, $(Sr, Ca)_2Si_5(ON)_8$:Eu, and $(Sr, Ba)SiAl_4N_7$:Eu.

In case of sulfide-based phosphors, a red phosphor may include at least one of compositions among (Sr, Ca)S:Eu and $(Y, Gd)_2O_2S$:Eu, and a green phosphor may include a composition of $SrGa_2S_4$:Eu.

In case of fluoride-based phosphors, for example, a KSF-based red phosphor may include a composition of $K_2SiF_6$:$Mn^{4+}$.

Phosphor compositions should comply with Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone, or a coactivator, or the like, may be additionally applied to change characteristics.

Also, materials such as quantum dots, or the like, may be applied as materials that replace phosphors, and phosphors and quantum dots may be used in combination or alone in an LED.

A quantum dot may have a structure including a core (3 nm to 10 nm) such as CdSe, InP, or the like, a shell (0.5 nm to 2 nm) such as ZnS, ZnSe, or the like, and a ligand for stabilizing the core and the shell, and may implement various colors according to sizes.

Table 1 below shows types of phosphors in applications fields of white light emitting devices using a blue LED (wavelength: 440 nm to 460 nm).

TABLE 1

| Purpose | Phosphor |
| --- | --- |
| LED TV BLU | $\beta$-SiAlON:$Eu^{2+}$ |
|  | (Ca,Sr)AlSiN$_3$:$Eu^{2+}$ |
|  | La$_3$Si$_6$O$_{11}$:$Ce^{3+}$ |
|  | K$_2$SiF$_6$:$Mn^{4+}$ |
| Lighting device | Lu$_3$Al$_5$O$_{12}$:$Ce^{3+}$ |
|  | Ca-$\alpha$-SiAlON:$Eu^{2+}$ |
|  | La$_3$Si$_6$N$_{11}$:$Ce^{3+}$ |
|  | (Ca,Sr)AlSiN$_3$:$Eu^{2+}$ |
|  | Y$_3$Al$_5$O$_{12}$:$Ce^{3+}$ |
|  | K$_2$SiF$_6$:$Mn^{4+}$ |
| Side Viewing | Lu$_3$Al$_5$O$_{12}$:$Ce^{3+}$ |
| (Mobile, | Ca-$\alpha$-SiAlON:$Eu^{2+}$ |
| Notebook PC) | La$_3$Si$_6$N$_{11}$:$Ce^{3+}$ |
|  | (Ca,Sr)AlSiN$_3$:$Eu^{2+}$ |
|  | Y$_3$Al$_5$O$_{12}$:$Ce^{3+}$ |
|  | (Sr,Ba,Ca,Mg)$_2$SiO$_4$ |
|  | K$_2$SiF$_6$:$Mn^{4+}$ |
| Electrical | Lu$_3$Al$_5$O$_{12}$:$Ce^{3+}$ |
| component | Ca-$\alpha$-SiAlON:$Eu^{2+}$ |
| (headlamp, etc) | La$_3$Si$_6$N$_{11}$:$Ce^{3+}$ |
|  | (Ca,Sr)AlSiN$_3$:$Eu^{2+}$ |
|  | Y$_3$Al$_5$O$_{12}$:$Ce^{3+}$ |
|  | K$_2$SiF$_6$:$Mn^{4+}$ |

Phosphors or quantum dots may be applied by using at least one of a method of spraying them on a light emitting device, a method of covering as a film, and a method of attaching as a sheet of ceramic phosphor, or the like.

As the spraying method, dispensing, spray coating, or the like, is generally used, and dispensing includes a pneumatic method and a mechanical method such as a screw fastening scheme, a linear type fastening scheme, or the like. Through a jetting method, an amount of dotting may be controlled through a very small amount of discharging and color coordinates (or chromaticity) may be controlled therethrough. In the case of a method of collectively applying phosphors on a wafer level or on a mounting board on which an LED is mounted, productivity can be enhanced and a thickness can be easily controlled.

The method of directly covering a light emitting device with phosphors or quantum dots as a film may include electrophoresis, screen printing, or a phosphor molding method, and these methods may have a difference according to whether a lateral surface of a chip is required to be coated or not.

In order to control efficiency of a long wavelength light emitting phosphor re-absorbing light emitted in a short wavelength, among two types of phosphors having different light emitting wavelengths, two types of phosphor layer having different light emitting wavelengths may be provided, and in order to minimize re-absorption and interference of chips and two or more wavelengths, a DBR (ODR) layer may be included between respective layers. In order to form a uniformly coated film, after a phosphor is fabricated as a film or a ceramic form and attached to a chip or a light emitting device.

In order to differentiate light efficiency and light distribution characteristics, a light conversion material may be positioned in a remote form, and in this case, the light conversion material may be positioned together with a material such as a light-transmissive polymer, glass, or the like, according to durability and heat resistance.

A phosphor applying technique plays the most important role in determining light characteristics in an LED device, so techniques of controlling a thickness of a phosphor application layer, a uniform phosphor distribution, and the like, have been variously researched.

A quantum dot (QD) may also be positioned in a light emitting device in the same manner as that of a phosphor, and may be positioned in glass or a light-transmissive polymer material to perform optical conversion.

As set forth above, according to exemplary embodiments of the present disclosure, a light emitting device and a light source driving apparatus, highly compatible with respect to an external input voltage and driven with high efficiency, may be obtained.

Advantages and effects of the present disclosure are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the spirit and scope of the present disclosure as defined by the appended claims.

What is claimed is:

1. A light emitting device comprising:
    a light source including a first LED array including a plurality of first LEDs connected in series and a second LED array including a plurality of second LEDs connected in series;
    a connection controller to selectively set a connection structure between the first and second LED arrays as a series connection, a parallel connection, and a series-parallel connection based on a peak value of a driving voltage driving the light source unit; and
    a driving controller to control a number of LEDs that are driven by the driving voltage in the light source according to a magnitude of the driving voltage, wherein each of the first and second LED arrays is connected between a plurality of first nodes and a plurality of second nodes, wherein:
    the connection controller includes a connection switch to set the connection structure between the first and second LED arrays through a switching operation, and a connection switching controller to control a switching operation of the connection switch, and
    the connection switch includes a plurality of first connection switches each connected between the plurality of first nodes or between the plurality of second nodes, at least one second connection switch connected to at least one node between the plurality of first LEDs and at least one node between the plurality of second LEDs, and at least one third connection switch connected to at least one of the plurality of first nodes and at least one of the plurality of second nodes.

2. The light emitting device of claim 1, wherein when the peak value of the driving voltage is smaller than a pre-set value, the connection switching controller switches the plurality of first connection switches and the at least one second connection switch ON and switches the at least one third connection switch OFF, and when the peak value of the driving voltage is greater than the pre-set value, the connection switching controller switches the at least one third connection switch ON and switches the plurality of first connection switches and the at least one second connection switch OFF.

3. The light emitting device of claim 2, wherein the driving controller comprises:
at least one driving switch connecting with ground a node selected from among a plurality of nodes between the plurality of first LEDs and a plurality of nodes between the plurality of second LEDs; and
a driving switching controller to control a switching operation of the at least one driving switch.

4. The light emitting device of claim 3, wherein the connection controller sets the connection structure between the first and second LED arrays of the light source such that first to nth light emitting groups (wherein n is an integer equal to or greater than 2) are connected in series, and the driving switching controller controls the number of light emitting groups that are driven by the driving voltage according to ON/OFF switching of the driving switch.

5. A light source driving apparatus for controlling an operation of a light source including a first LED array including a plurality of first LEDs connected in series and a second LED array including a plurality of second LEDs connected in series, the first LED array and the second LED array being connected between a plurality of first nodes and a plurality of second nodes, the light source driving apparatus comprising:
a connection controller to selectively set a connection structure between the first and second LED arrays as a series connection, a parallel connection, and a series-parallel connection based on a peak value of a driving voltage provided to the light source; and
a driving controller to control the number of LEDs that are driven in the light source according to a magnitude of the driving voltage provided to the light source unit, wherein:
the connection controller includes a connection switch to set the connection structure between the first and second LED arrays through a switching operation, and a connection switching controller to control a switching operation of the connection switch, and
the connection switch includes a plurality of first connection switches each connected between the plurality of first nodes or between the plurality of second nodes, at least one second connection switch connected to at least one node between the plurality of first LEDs and at least one node between the plurality of second LEDs, and at least one third connection switch connected to at least one of the plurality of first nodes and at least one of the plurality of second nodes.

6. A light source driving apparatus comprising:
a connection controller to selectively set a connection structure between a plurality of LEDs such that the LEDs are arranged into a series connection of first to nth light emitting groups (wherein n is an integer equal to or greater than 2), wherein the connection controller selectively sets a connection structure between LEDs in each light emitting group as a series connection and a parallel connection based on a peak value of a driving voltage; and
a driving controller to control the number of light emitting groups that are driven by the driving voltage based on a current value of the driving voltage, wherein:
the connection controller includes a connection switch to set the connection structure between the first and second LED arrays through a switching operation, and a connection switching controller to control a switching operation of the connection switch, and
the connection switch includes a plurality of first connection switches each connected between the plurality of first nodes or between the plurality of second nodes, at least one second connection switch connected to at least one node between the plurality of first LEDs and at least one node between the plurality of second LEDs, and at least one third connection switch connected to at least one of the plurality of first nodes and at least one of the plurality of second nodes.

7. The light emitting device of claim 4, wherein the driving switching controller changes the number of light emitting groups that are driven by the driving voltage on a periodic basis in synchronization with a periodic variation of the driving voltage.

8. The light emitting device of claim 4, wherein when a magnitude of the driving voltage is increased, the driving switching controller controls a switching operation of the at least one driving switch such that the number of driven light emitting groups among the first to nth light emitting groups is increased.

9. The light emitting device of claim 4, wherein each of the first to nth light emitting groups has a connection structure in which at least one of the plurality of first LEDs and at least one of the plurality of second LEDs are connected in parallel.

10. The light emitting device of claim 4, wherein each of the first to nth light emitting groups has a connection structure in which two or more of the plurality of first LEDs and the plurality of second LEDs are connected in series.

11. The light emitting device of claim 1, wherein the light source unit further comprises a third LED array connected between the plurality of first nodes and the plurality of second nodes and having a plurality of third LEDs connected in series, wherein the connection controller is configured to selectively set a connection structure among the first, second, and third LED arrays as a series connection, a parallel connection, and a series-parallel connection based on the peak value of the driving voltage.

12. The light emitting device of claim 11, wherein the connection controller comprises:
a connection switch unit configured to set the connection structure between the first, second, and third LED arrays through a switching operation; and
a connection switching controller configured to control a switching operation of the connection switch unit.

13. The light emitting device of claim 12, wherein the connection switch unit comprises:
a plurality of first connection switches each connected between the plurality of first nodes or between the plurality of second nodes;
a plurality of second connection switches; and
at least one third connection switch connected to at least one of the plurality of first nodes and at least one of the plurality of second nodes,
wherein the plurality of second connection switches comprises:

a connection switch connecting at least one of the nodes between the plurality of first LEDs and at least one of the nodes between the plurality of second LEDs, and a connection switch connecting at least one of the nodes between the plurality of second LEDs and at least one of the nodes between the plurality of third LEDs.

14. The light emitting device of claim 1, wherein each of the LEDs comprises:

a light emitting laminate in which a first conductivity-type semiconductor layer, an active layer, and a second conductivity-type semiconductor layer are stacked; and a conductive via electrically connected to the first conductivity-type semiconductor layer through the second conductivity-type semiconductor layer and the active layer and electrically insulated from the second conductivity-type semiconductor layer and the active layer, wherein an area of a region in which the conductive via and the first conductivity-type semiconductor layer are in contact is 1% to 5% of a planar area of the light emitting laminate.

15. The light emitting device of claim 1, wherein the first and second LED arrays emit white light having two or more peak wavelengths, the white light is positioned in a segment linking (x, y) coordinates (0.4476, 0.4074), (0.3484, 0.3516), (0.3101, 0.3162), (0.3128, 0.3292), and (0.3333, 0.3333) in a CIE 1931 chromaticity diagram or is positioned in a region surrounded by a spectrum of black body radiation and the segment, and a color temperature of the white light ranges from 2000K to 20000K.

16. The light source driving apparatus of claim 5, wherein the driving controller changes the number of LEDs that are driven in the light source unit on a periodic basis in synchronization with a periodic variation of the driving voltage.

17. The light source driving apparatus of claim 6, wherein the driving controller controls the number of light emitting groups that are driven by the driving voltage on a periodic basis in synchronization with a periodic variation of the driving voltage.

18. The light source driving apparatus of claim 6, wherein a plurality of driving switches are operative to individually connect to ground each of the nodes between light emitting groups in the series connection of first to nth light emitting groups, and the driving controller controls the number of light emitting groups that are driven by the driving voltage by controlling ON/OFF switching of the driving switches.

* * * * *